(12) United States Patent
Lee et al.

(10) Patent No.: US 7,015,537 B2
(45) Date of Patent: Mar. 21, 2006

(54) ISOLATION-LESS, CONTACT-LESS ARRAY OF NONVOLATILE MEMORY CELLS EACH HAVING A FLOATING GATE FOR STORAGE OF CHARGES, AND METHODS OF MANUFACTURING, AND OPERATING THEREFOR

(75) Inventors: Dana Lee, Santa Clara, CA (US); Hieu Van Tran, San Jose, CA (US); Jack Frayer, Boulder Creek, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 58 days.

(21) Appl. No.: 10/822,944

(22) Filed: Apr. 12, 2004

(65) Prior Publication Data

US 2005/0224861 A1    Oct. 13, 2005

(51) Int. Cl.
*H01L 29/788* (2006.01)
(52) U.S. Cl. .................. 257/316; 257/315; 257/317
(58) Field of Classification Search ............... 257/315, 257/316, 317
See application file for complete search history.

(56) References Cited

U.S. PATENT DOCUMENTS

| | | | |
|---|---|---|---|
| 5,029,130 A | 7/1991 | Yeh | |
| 6,103,573 A | 8/2000 | Harari et al. | |
| 6,329,685 B1 | 12/2001 | Lee | |
| 6,420,231 B1 | 7/2002 | Harari et al. | |
| 6,717,203 B1 * | 4/2004 | Wong et al. | 257/315 |
| 6,747,310 B1 * | 6/2004 | Fan et al. | 257/320 |
| 6,937,514 B1 * | 8/2005 | Hasegawa | 365/185.12 |

OTHER PUBLICATIONS

Yoshida, et al., "A 1Gb Multi-Level AG-AND-Type Flash Memory With 10MB/s Programming Throughput for Mass Storage Application," 2003 IEEE International Solid State Circuits Conference, Session 16, 10 pgs., (2003).
Sasago, et al., "10-MB/s Multi-Level Programming of Gb-Scale Flash Memory Enabled by New AG-AND Cell Technology," IEDM 2002, pp. 952-954.

* cited by examiner

*Primary Examiner*—Ngân V. Ngô
(74) *Attorney, Agent, or Firm*—DLA Piper Rudnick Gray Cary US LLP

(57) ABSTRACT

An isolation-less, contact-less nonvolatile memory array has a plurality of memory cells each with a floating gate for the storage of charges thereon, arranged in a plurality of rows and columns. Each memory cell can be of a number of different types. All the bit lines and source lines of the various embodiments are buried and are contact-less. In a first embodiment, each cell can be represented by a stacked gate floating gate transistor coupled to a separate assist transistor. The entire array can be planar; or in a preferred embodiment each of the floating gate transistors is in a trench; or each of the assist transistors is in a trench. In a second embodiment, each cell can be represented by a stacked gate floating gate transistor with the transistor in a trench. In a third embodiment, each cell can be represented by two stacked gate floating gate transistors coupled to a separate assist transistor, positioned between the two stacked gate floating gate transistors. The entire array can be planar; or in a preferred embodiment each of the floating gate transistors is in a trench; or each of the assist transistors is in a trench. Novel methods to manufacture the arrays and methods to program, erase, and read each of these embodiments of the memory cells is disclosed.

10 Claims, 11 Drawing Sheets

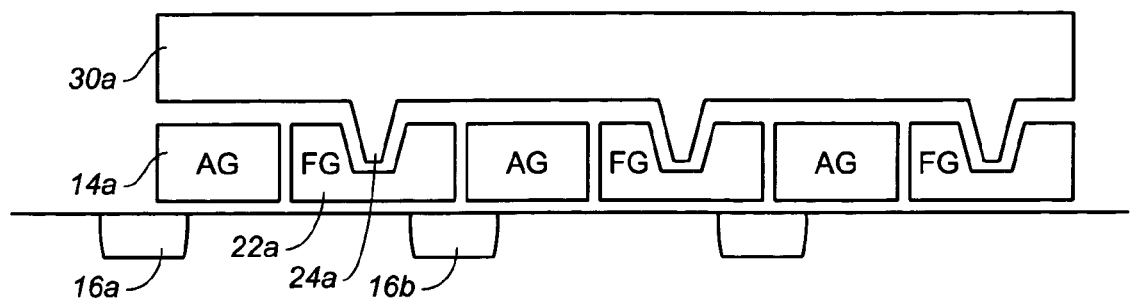
FIG._1a (PRIOR ART)
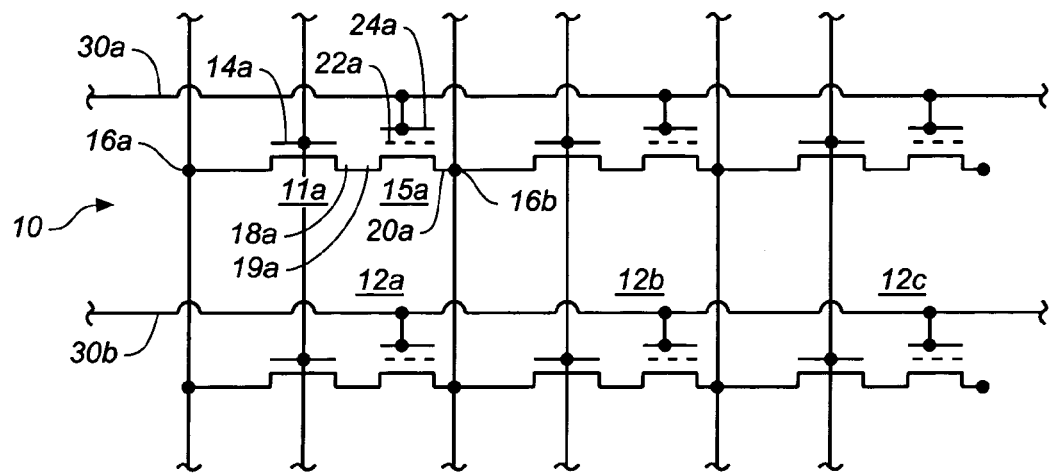
FIG._1b (PRIOR ART)
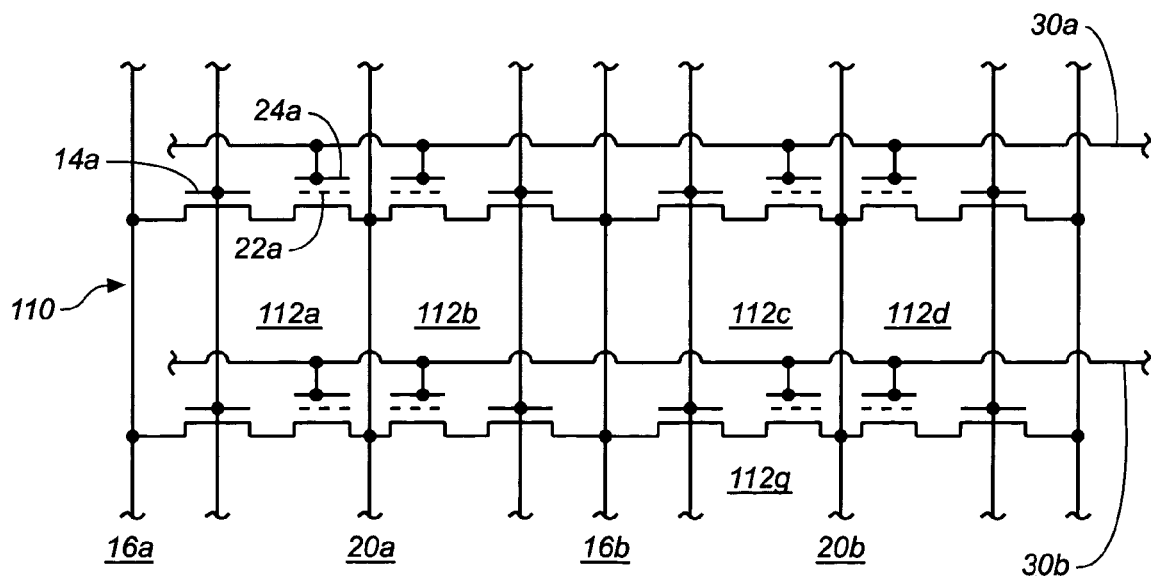
FIG._2

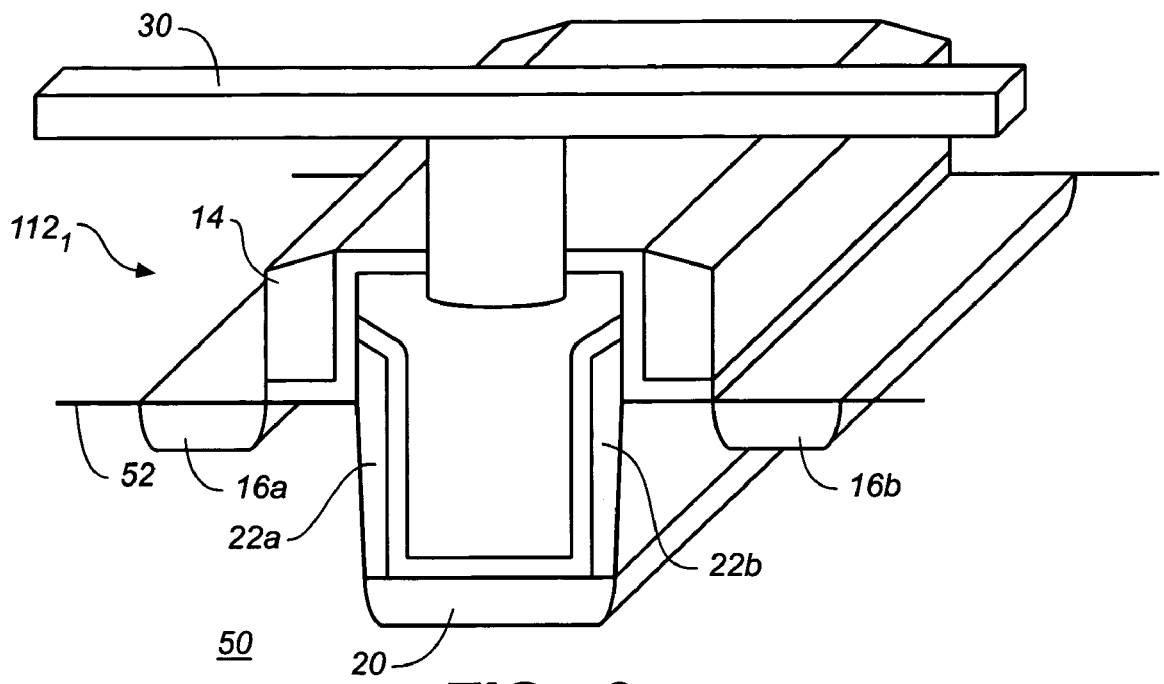
FIG._3a
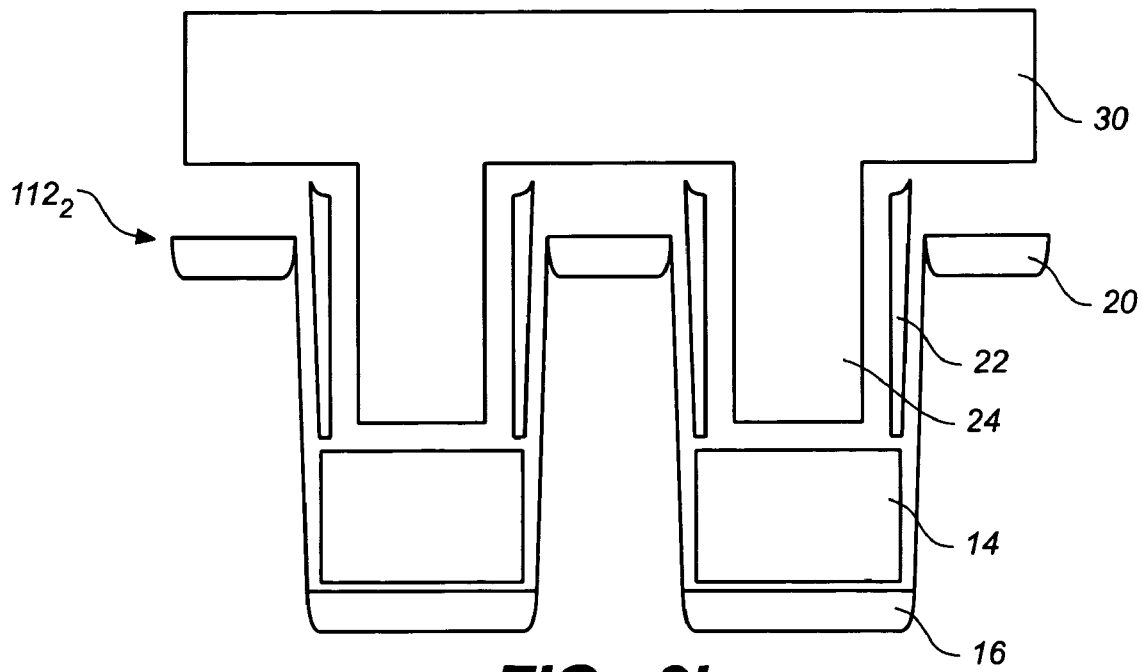
FIG._3b

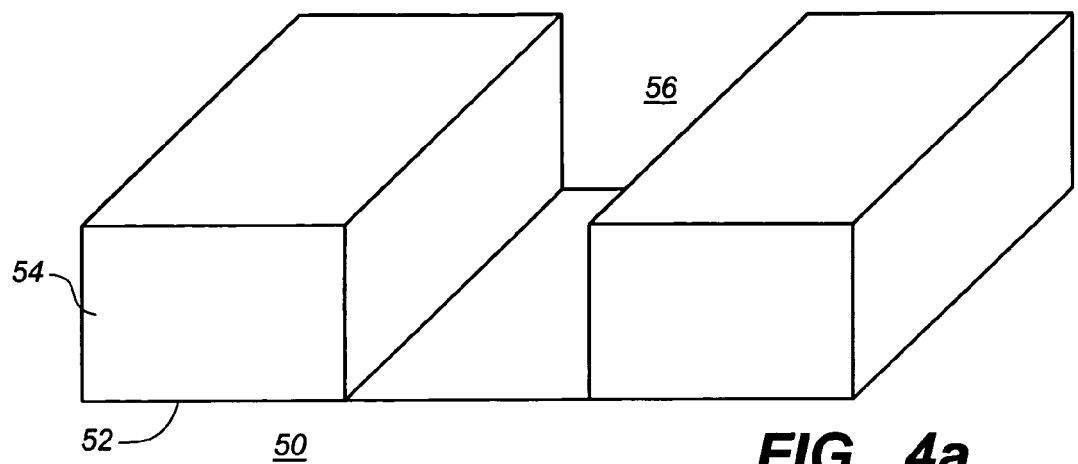
FIG._4a
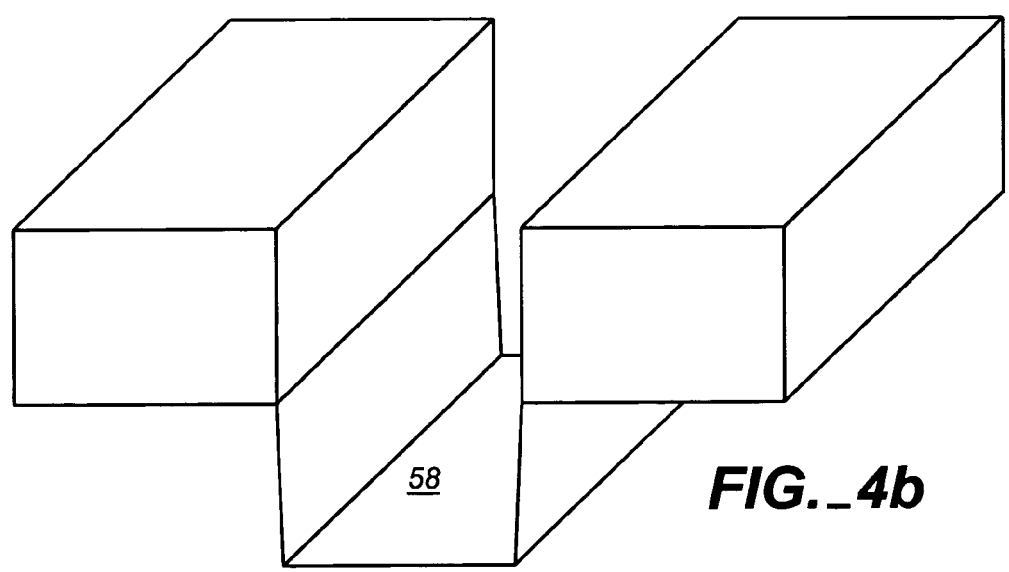
FIG._4b
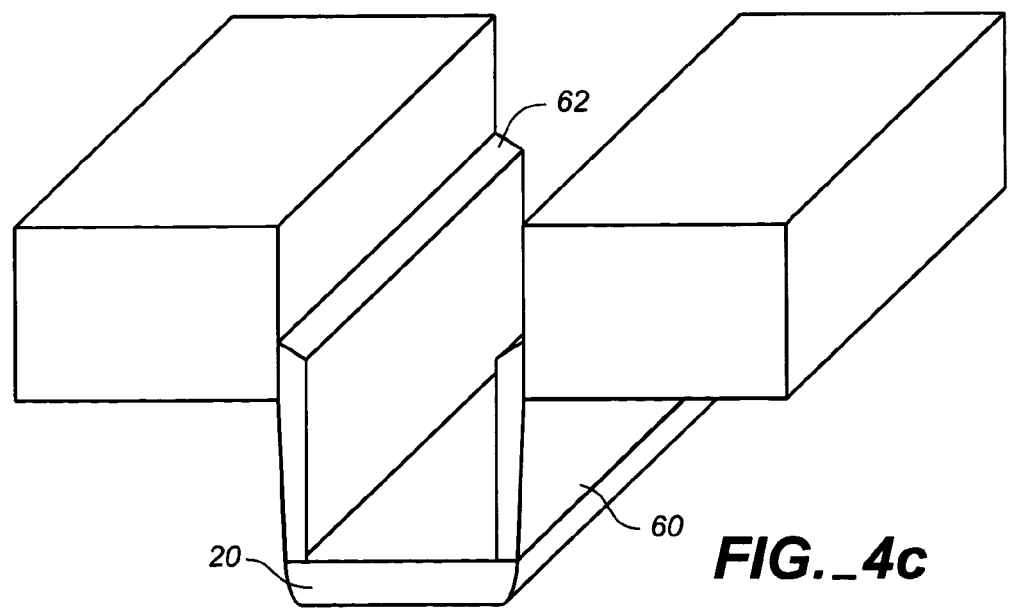
FIG._4c

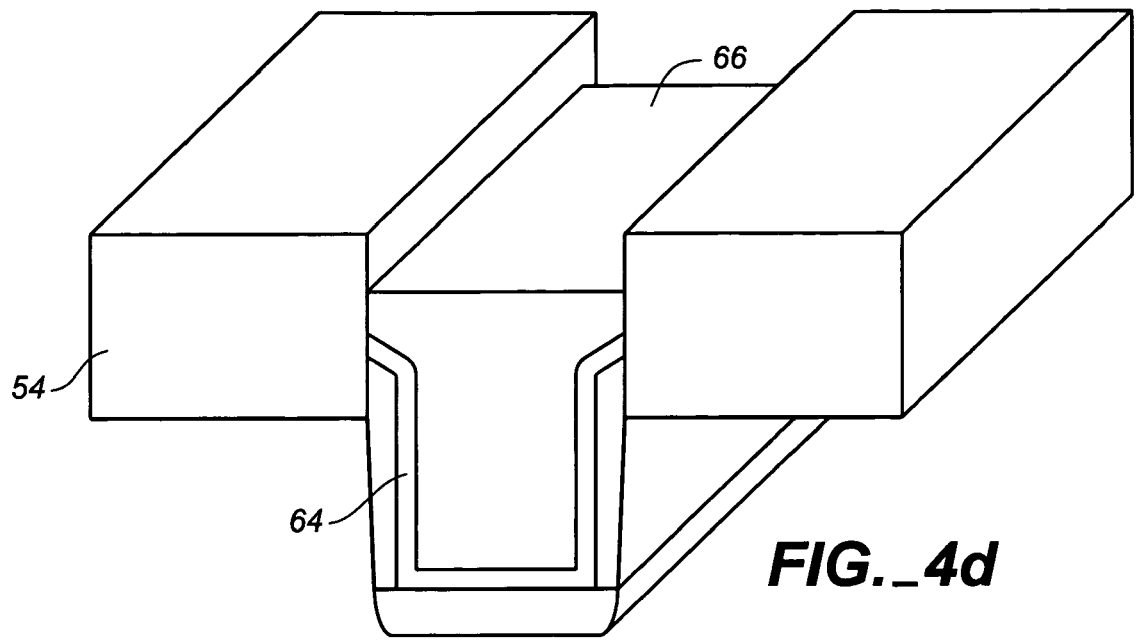
FIG._4d
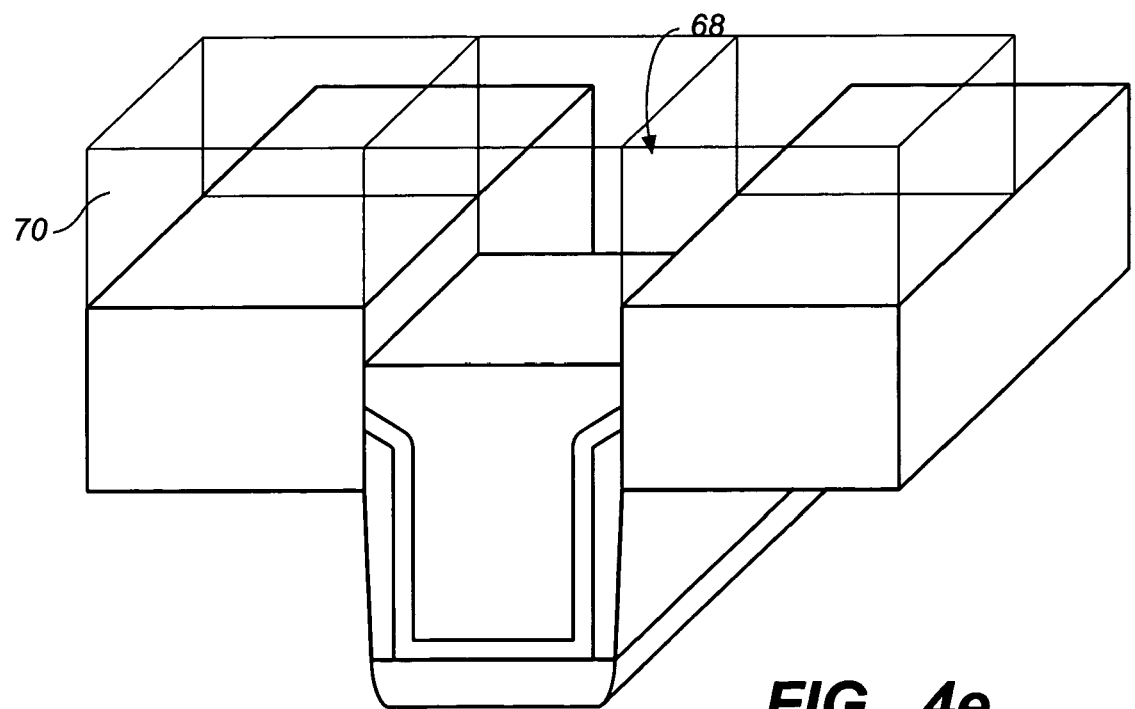
FIG._4e

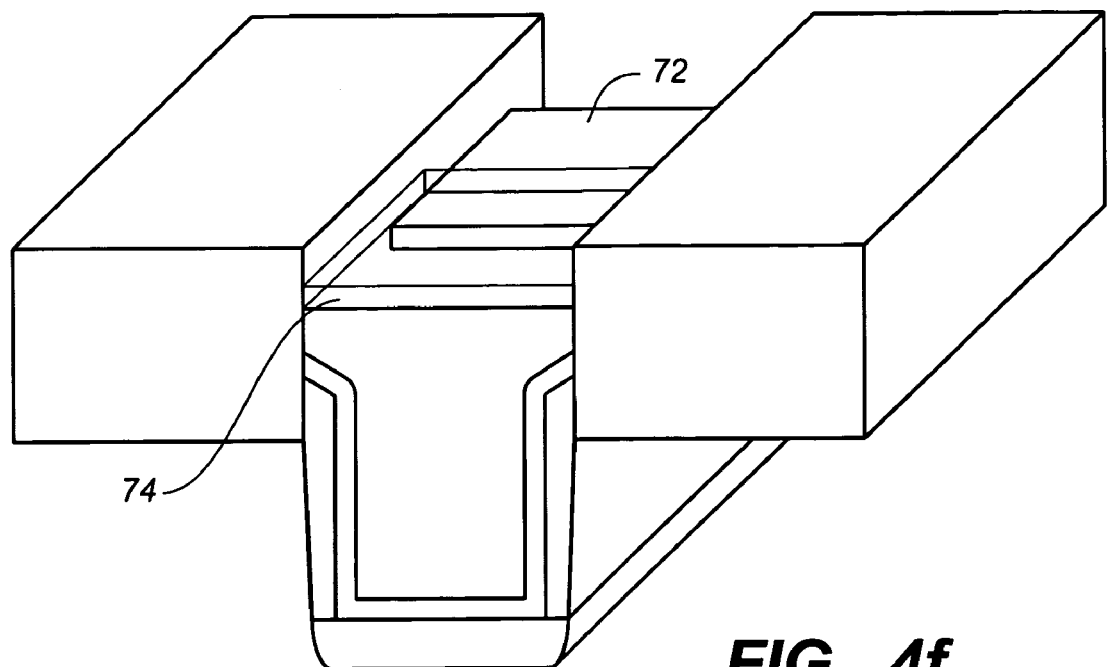
FIG._4f
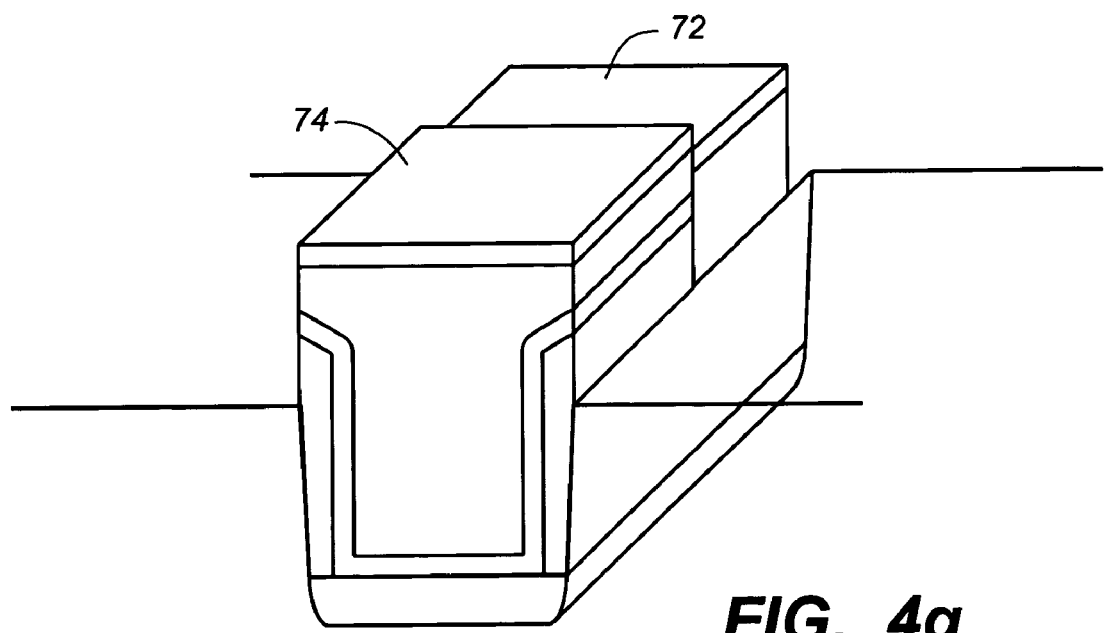
FIG._4g

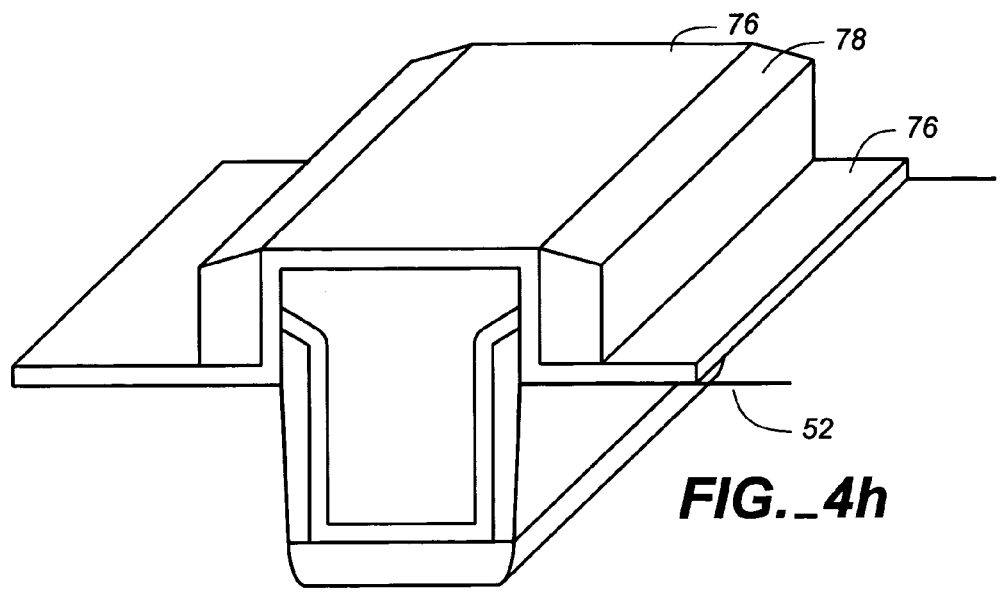
FIG._4h
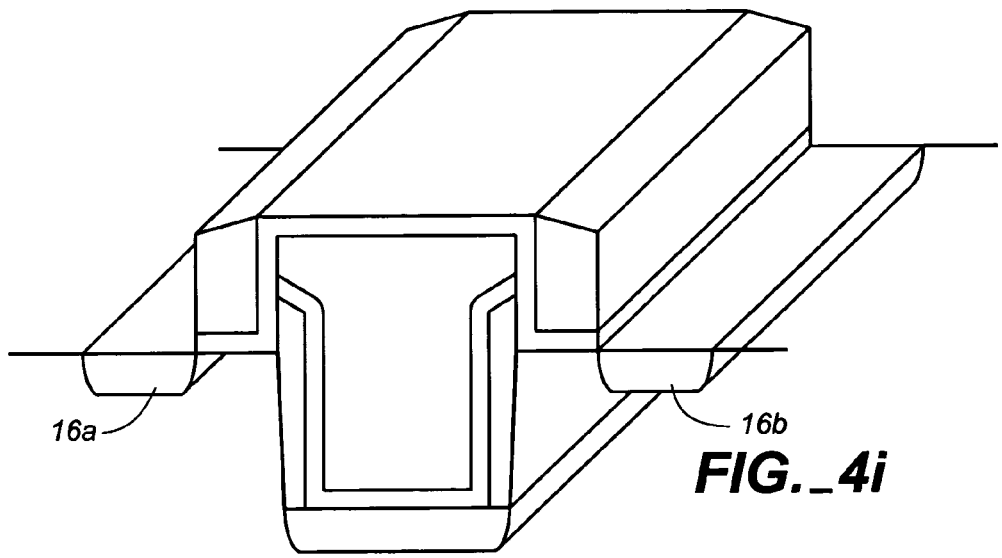
FIG._4i
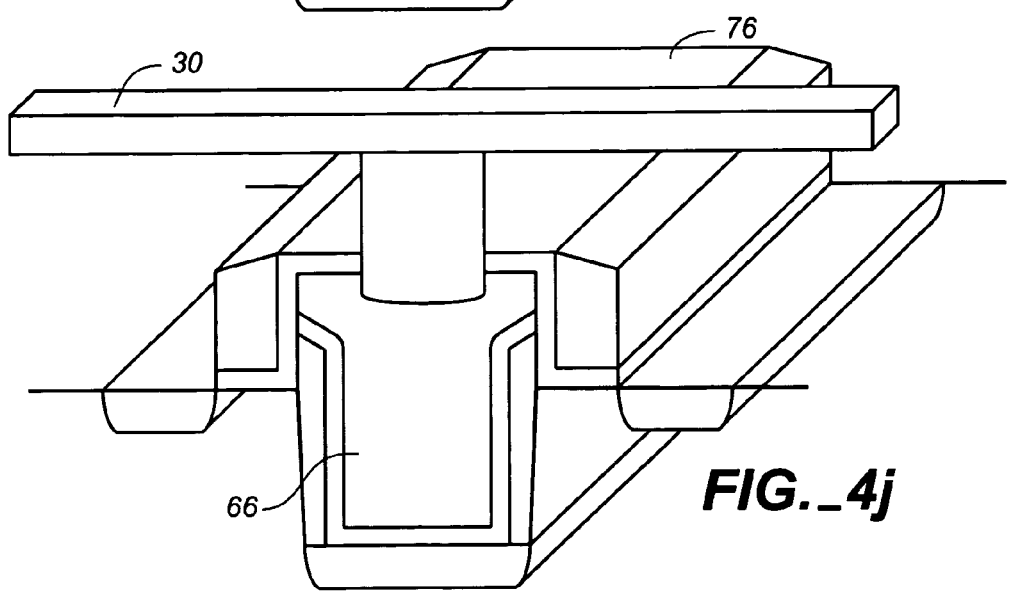
FIG._4j

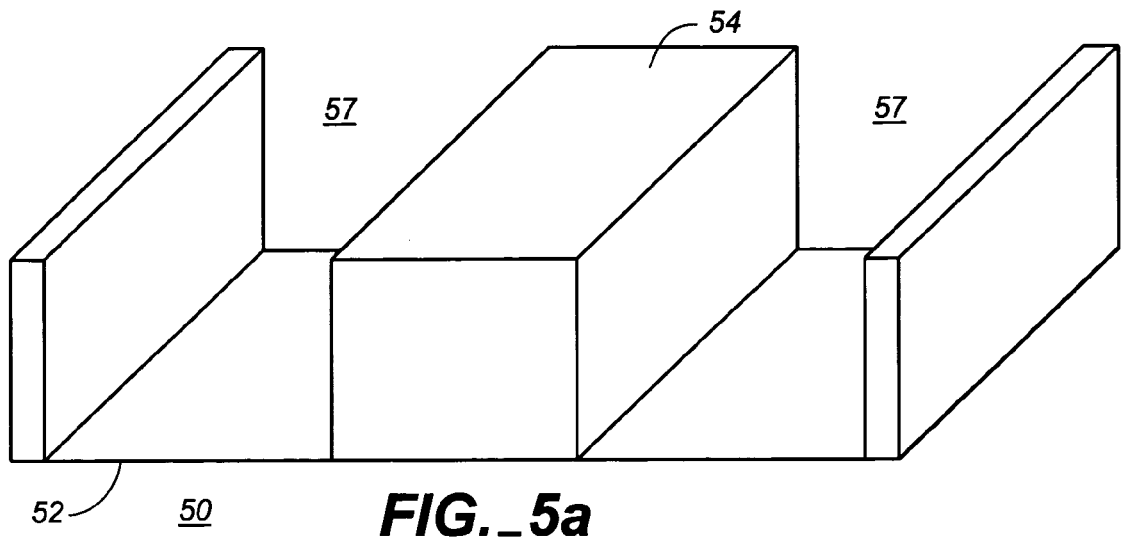
FIG._5a
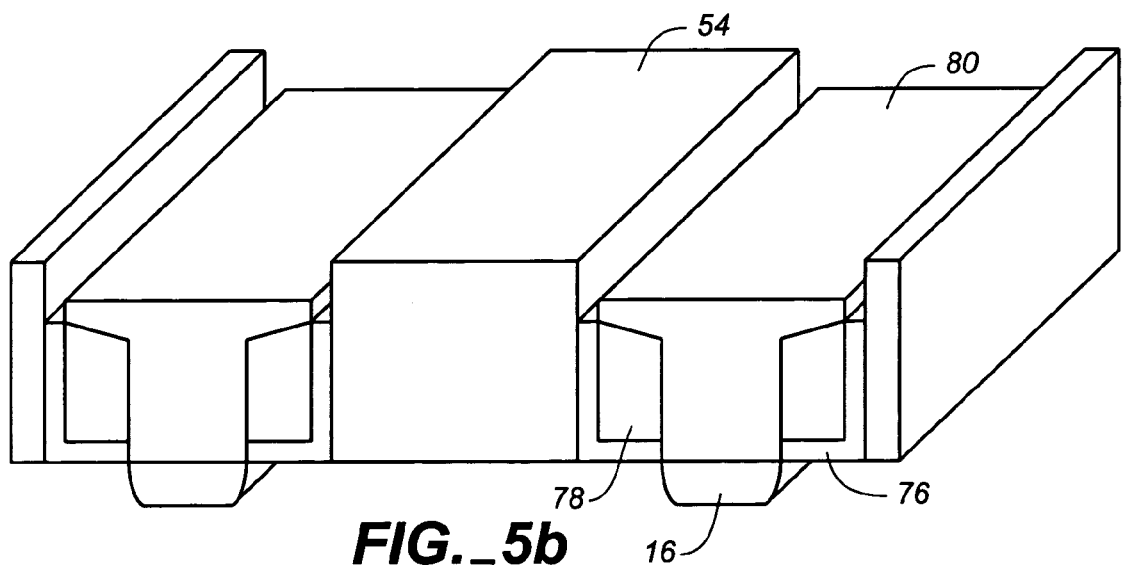
FIG._5b
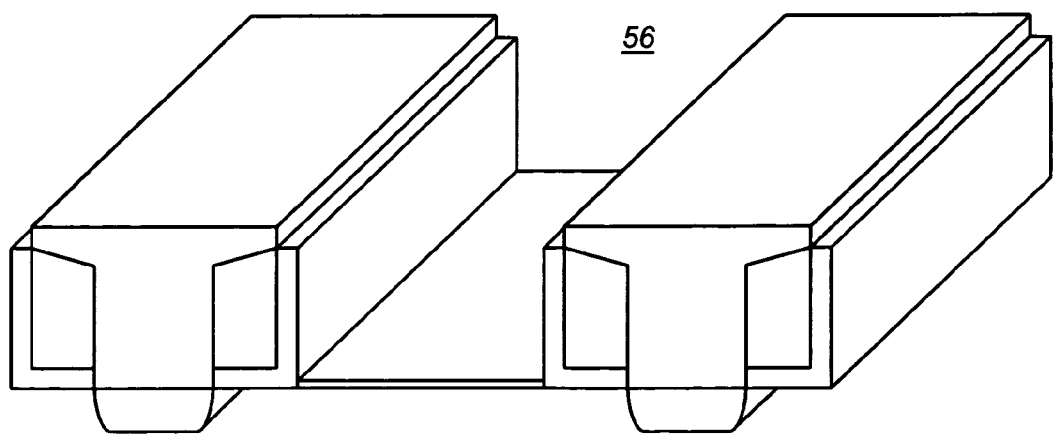
FIG._5c

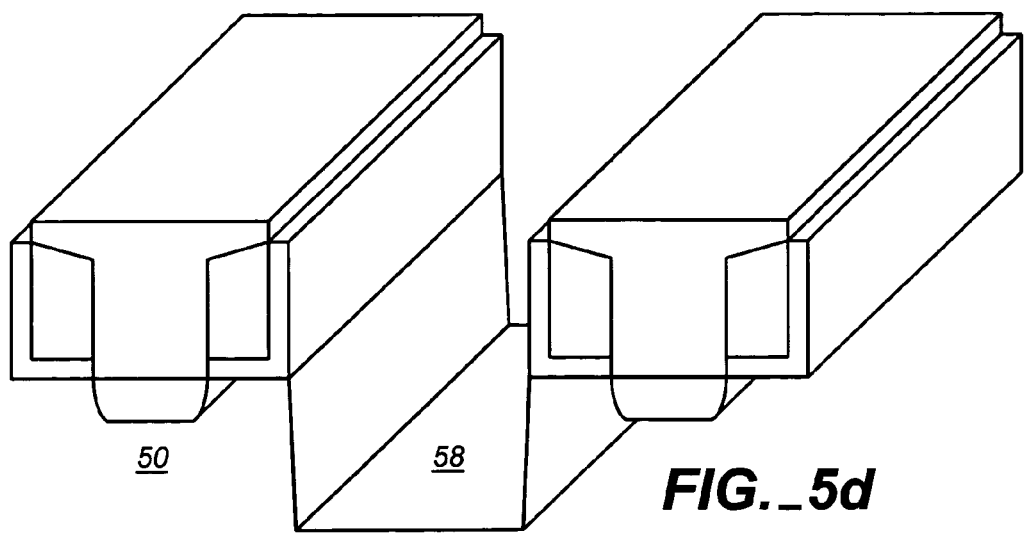
FIG._5d
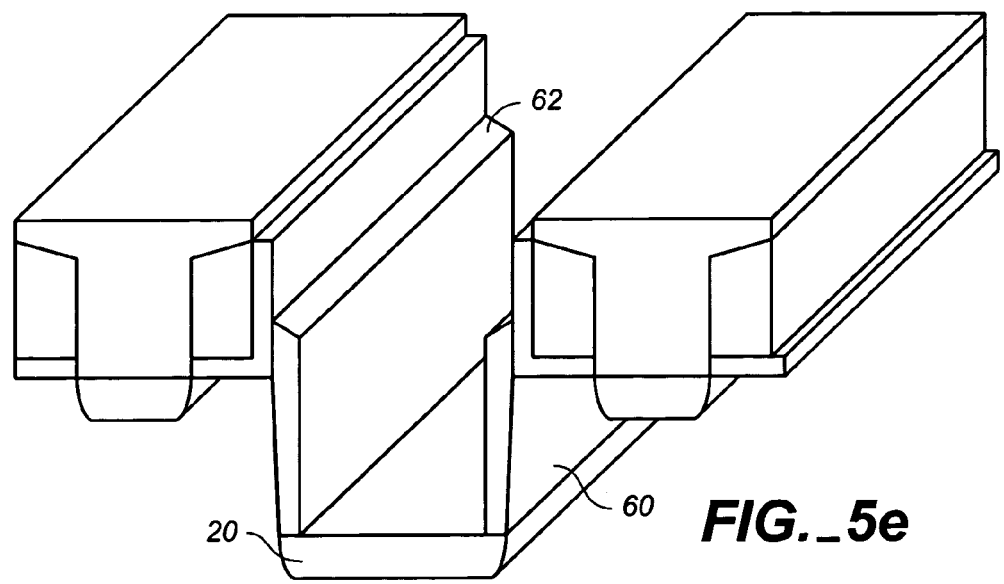
FIG._5e
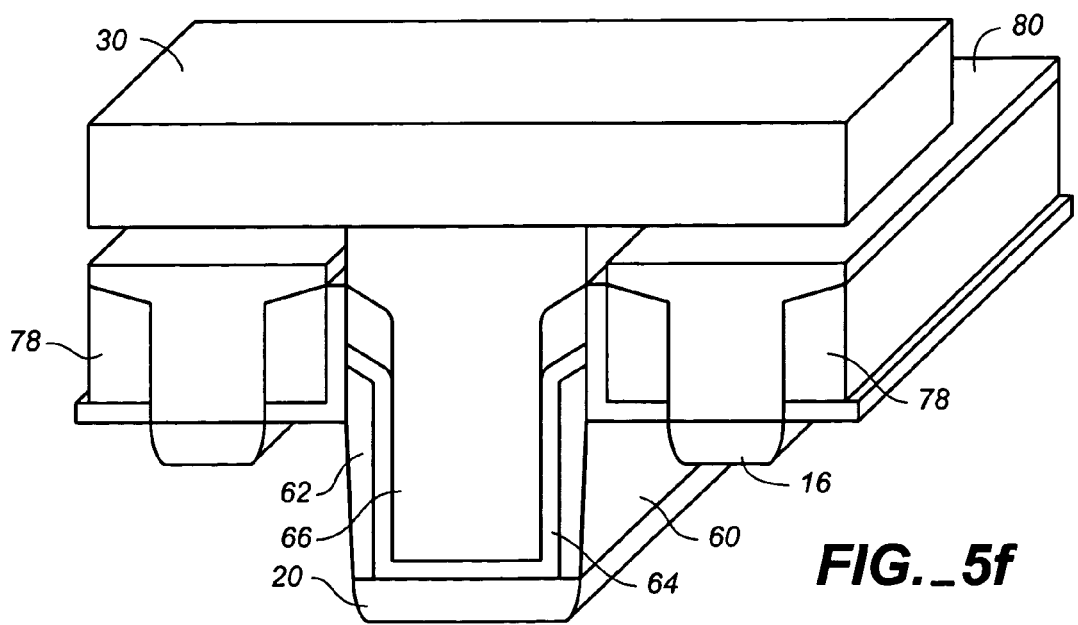
FIG._5f

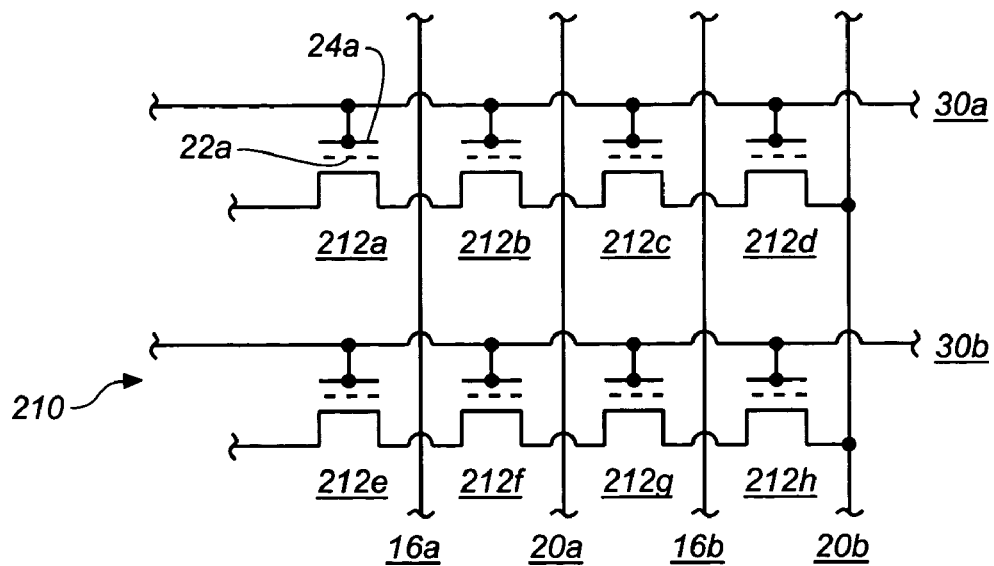
FIG._6
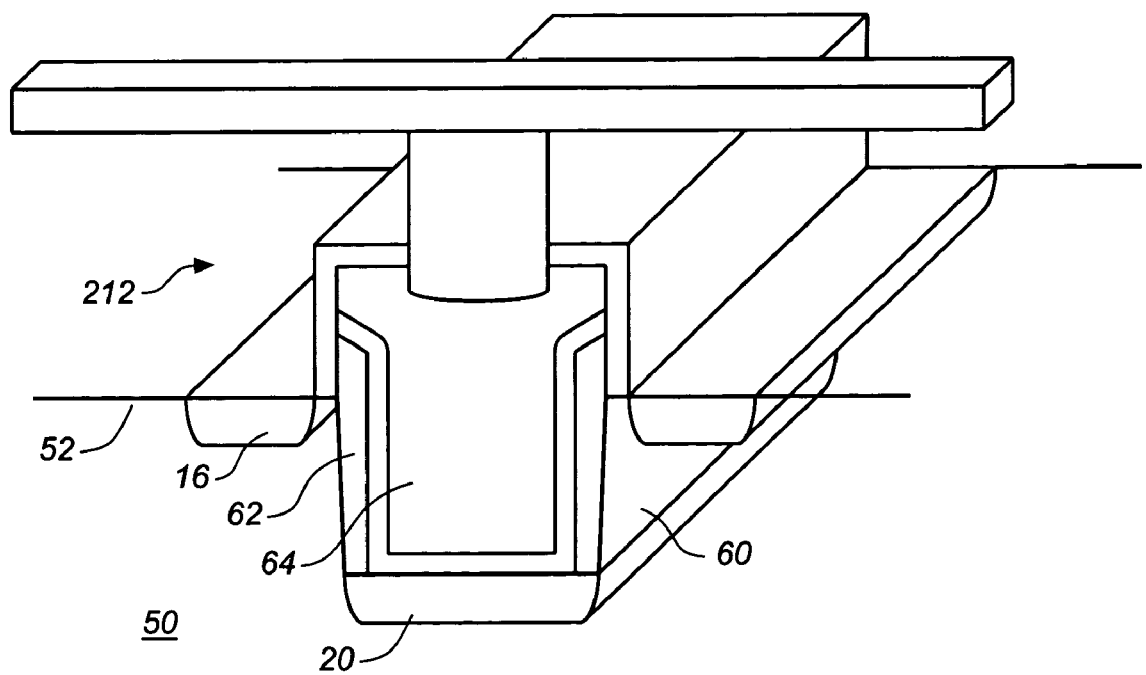
FIG._7

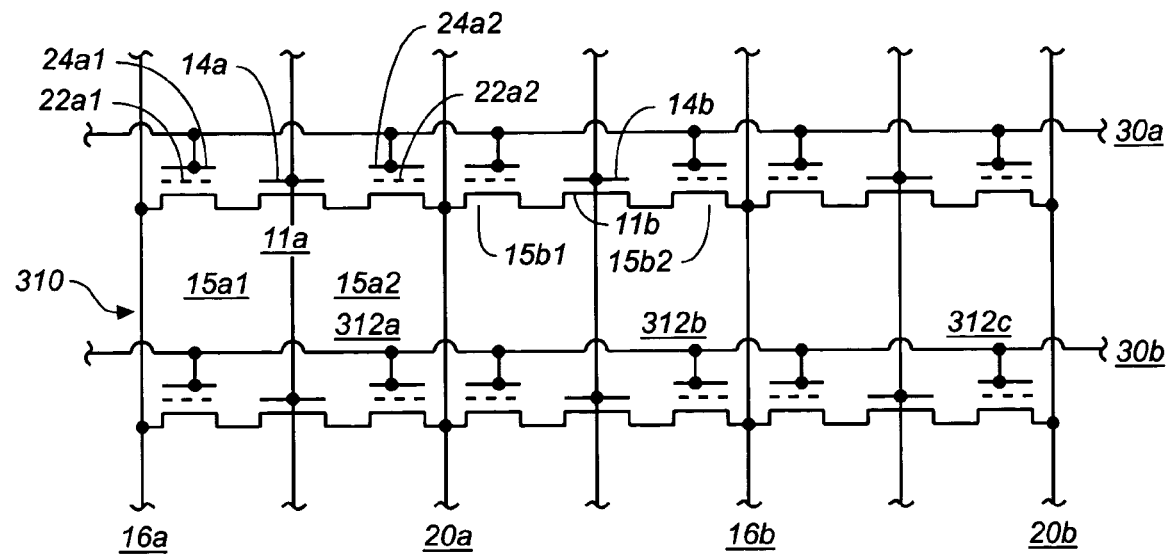
FIG._8
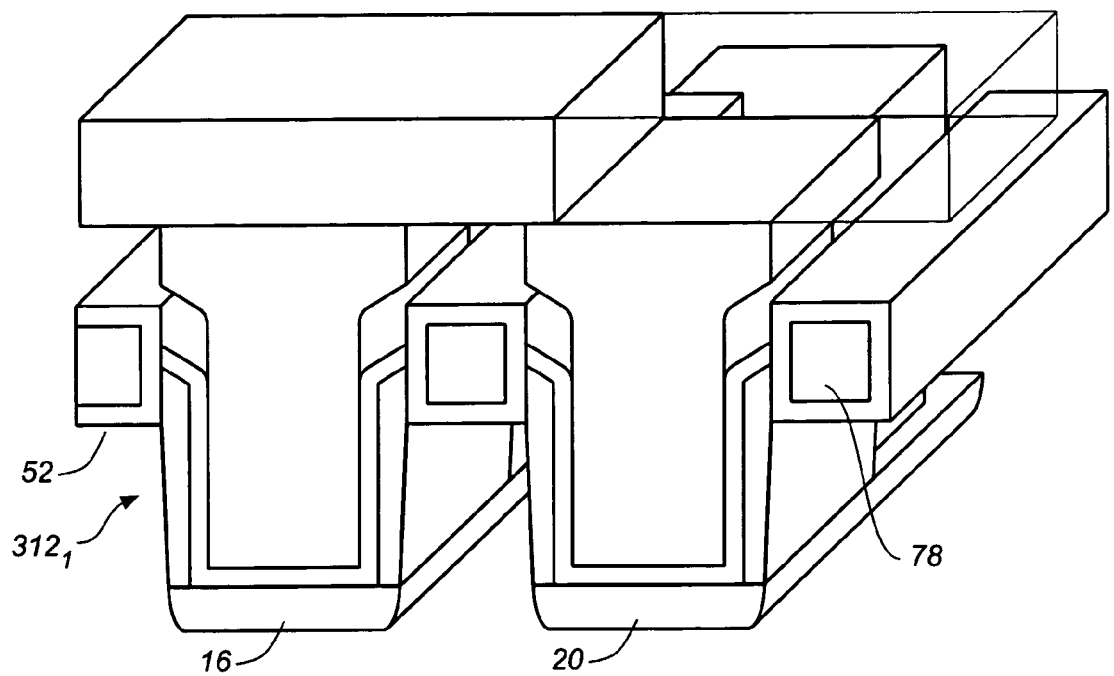
FIG._9a

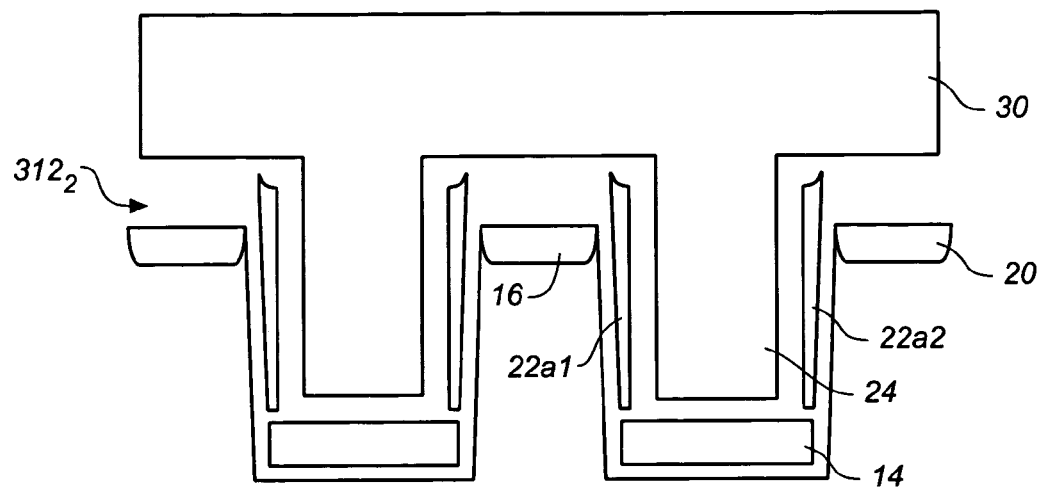
FIG._9b
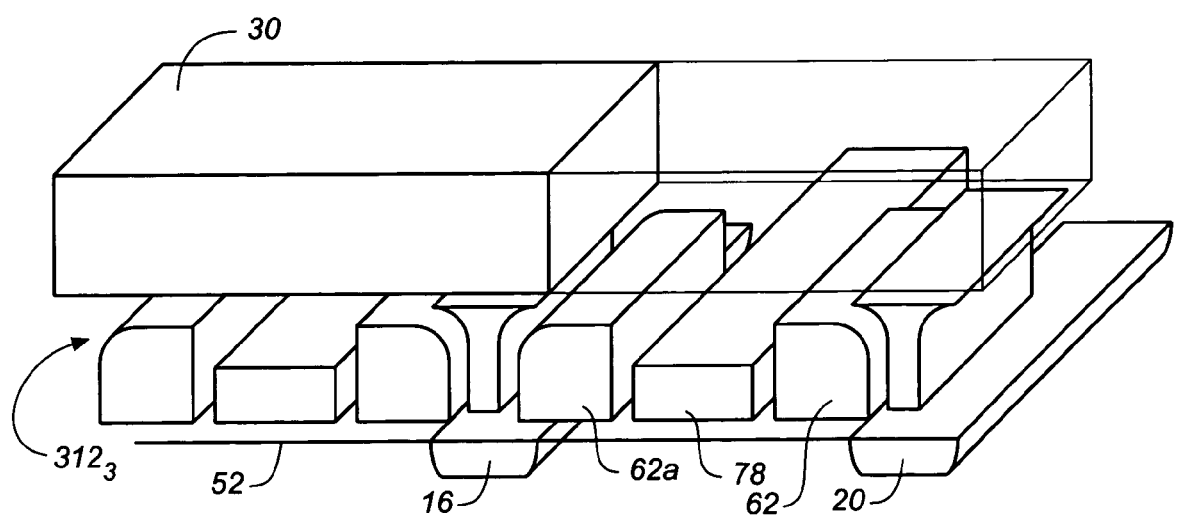
FIG._9c

ISOLATION-LESS, CONTACT-LESS ARRAY OF NONVOLATILE MEMORY CELLS EACH HAVING A FLOATING GATE FOR STORAGE OF CHARGES, AND METHODS OF MANUFACTURING, AND OPERATING THEREFOR

TECHNICAL FIELD

The present invention relates to an isolation-less contact-less array of floating gate nonvolatile memory cells and methods of manufacturing and operation. There are a number of configurations for each memory cell, including the storage of multi bits per cell.

BACKGROUND OF THE INVENTION

Nonvolatile memory cells having a floating gate for the storage of charges thereon to control the conduction of current in the channel in the substrate of the semiconductive material is well known in the art. See, for example, U.S. Pat. No. 5,029,130 whose disclosure is incorporated herein by reference in its entirety. Structurally, nonvolatile memory cells using a floating gate for storage can be classified as either a stacked gate configuration or a split gate configuration. In a stacked gate, a control gate is positioned directly over the floating gate. In a split gate, the control gate is positioned to one side and controls another portion of the channel along with the floating gate.

Contact-less arrays of floating gate nonvolatile memory cells are also well known in the art. The term "contact-less" means the source lines and the bit lines to the memory cells in the array are buried. Contact-less permits the memory cells to be positioned closer together since contacts or vias do not have to be etched in the semiconductor structure to contact the bit line or the source line. See, for example, U.S. Pat. Nos. 6,420,231 and 6,103,573. These patents disclose a contact-less array of floating gate nonvolatile memory cells but using field oxide to separate rows or columns of memory cells.

In an article entitled "A 1 Gb Multi-Level AG-AND-Type Flash Memory with 10 MB/s Programming Throughput for Mass Storage Application" by Keiichi Yoshida, et. al, published in the 2003 IEEE International Solid State Circuits Conference, Session 16 in 2003, the authors described an array of floating gate nonvolatile memory cells. See also, the paper entitled "10-MB/s Multi-Level Programming of Gb-Scale Flash Memory Enabled by New AG-AND Cell Technology" by Y. Sasago et. al, published in the 2002 IEDM, pp. 952–954.

A cross-sectional view of an array 10 of floating gate nonvolatile memory cells disclosed in the aforementioned paper is shown on FIG. 1A. A schematic diagram of the array 10 is shown in FIG. 1B. The array 10 comprises a plurality memory cells 12 arranged in a plurality of rows and columns. Each memory cell comprises a conventional transistor 11 having a gate 14 and a first terminal 16 and second terminal 18. In addition, the memory cell 12 comprises a stacked gate floating gate transistor 15 having a control gate 24, a floating gate 22, a first terminal 19 connected to the second terminal 18 of the transistor 11 and a second terminal 20. Thus each memory cell 12 has four terminals: a first terminal 16, a second terminal 20, a transistor gate terminal 14 and a control gate terminal 24. Further, as can be seen from FIG. 1B, adjacent memory cells 12 in the same row share a common buried line, which is a buried source line for memory cells to one side, and is a buried bit line for memory cells to another side. In addition, memory cells 12 in the same column have the transistor gates 14 connected together. Thus the buried source lines 20, buried bit lines 16, and the transistor gates 14, all run in the column direction. Finally, memory cells in the same row have their control gates 24 connected to the same row line 30. Further, all of the memory cells 12 are manufactured on a planar surface of a semiconductor substrate.

It is one object of the present invention to increase the density of the array 10 and to provide methods for manufacturing such improved memory cell array.

SUMMARY OF THE INVENTION

Accordingly, in the present invention, an array of nonvolatile memory cells comprises a semiconductor substrate with a plurality of nonvolatile memory cells formed in the substrate arranged in a plurality rows and columns.

In a first embodiment, each memory cell comprises a first terminal and a second terminal with a channel therebetween with the channel having a first portion and a second portion. A transistor gate is insulated from the substrate and positioned to control the conduction of current in the first portion of the channel. A floating gate is insulated from the substrate and is positioned to control the conduction of current in the second portion of the channel. A control gate is capacitively coupled to the floating gate. A plurality of buried bit lines are arranged in the substrate substantially parallel to one another. Each buried bit line is electrically connected to the first terminal of the memory cells that are arranged in the same column wherein adjacent memory cells in the same row share a common buried bit line. A plurality of buried source lines are also in the substrate arranged substantially parallel to one another where each buried source line is electrically connected to the second terminal of memory cells arranged in the same column wherein adjacent memory cells in the same row share a common buried source line. A plurality of gate lines are arranged substantially parallel to one another with each gate line electrically connected to the transistor gate of memory cells arranged in the same column. Finally, a plurality of word lines are arranged substantially parallel to one another with each word line electrically connected to the control gate of memory cells arranged in the same row.

In a second embodiment, each memory cell comprises a first terminal and a second terminal with a channel therebetween in the substrate. The substrate has a planar surface. A trench extends in a first direction in the substrate with each trench having a side wall and a bottom wall. A floating gate is in the trench and is insulated from the side wall and is positioned to control the conduction of current in the channel. A control gate is in the trench capacitively coupled to the floating gate. The first terminal of each memory cell is in the substrate and is along the bottom wall of the trench. The second terminal is in the substrate and is along the planar surface adjacent to the trench. A plurality of buried bit lines are in the substrate arranged substantially parallel to one another with each buried bit line electrically connected to the second terminal of memory cells arranged in the same column wherein adjacent memory cells in the same row share a common buried bit line. A plurality of buried source lines are in the substrate arranged substantially parallel to one another with each buried source line electrically connected to the first terminal of memory cells arranged in the same column, where in adjacent memory cells in the same row share a common buried source line. A plurality of word line is arranged substantially parallel to one another with each word line electrically connected to the control gate of memory cells arranged in the same row.

In a third embodiment, each memory cell comprises a first terminal and a second terminal with a channel therebetween in the substrate with the channel having a first portion, a second portion and a third portion. A transistor gate is insulated from the substrate and is positioned to control the conduction of current in the second portion of the channel. A first floating gate is insulated from the substrate and is positioned to control the conduction of current in the first portion of the channel. A second floating gate is insulated from the substrate and is positioned to control the conduction of current in the third portion of the channel. The second portion of the channel is between the first portion of the channel and the third portion of the channel. A first control gate is capacitively coupled to the first floating gate. A second control gate is capacitively coupled to the second floating gate. A plurality of buried bit lines are in the substrate arranged substantially parallel to one another and arranged to connect memory cells in the same column. Each of a first plurality of buried bit lines electrically connects to the first terminal of memory cells arranged in the same column wherein adjacent memory cells in the same row share a common first terminal. Each of a second plurality buried bit lines is electrically connected to the second terminal of memory cells arranged in the same column wherein adjacent memory cells in the same row share a common second terminal. A plurality of gate lines are arranged substantially parallel to one another with each gate line electrically connected to the transistor gate of memory cells arranged in the same column. A plurality word lines are arranged substantially parallel to one another with each word line electrically connected to the first and second control gates of each memory cell arranged in the same row.

The present invention also discloses methods of manufacturing and operating the aforedescribed arrays of memory cells.

BRIEF DESCRIPTION OF THE DRAWINGS

FIG. 1A is a cross-sectional view of an array of floating gate nonvolatile memory cells of the prior art.

FIG. 1B is a schematic diagram of the array of floating gate nonvolatile memory cells shown in FIG. 1A.

FIG. 2 is a schematic diagram of a first embodiment of an isolation-less, contact-less, array of floating gate nonvolatile memory cells of the present invention.

FIG. 3A is a perspective cross-sectional view of a first version of a memory cell that can be used in the first embodiment shown in FIG. 2.

FIG. 3B is a cross-sectional view of a second version of a memory cell that can be used in the first embodiment shown in FIG. 2.

FIGS. 4A–4J are perspective cross-sectional views of the a method of the present invention to make the first version of the memory cell shown in FIG. 3A that can be used in the first embodiment of the array shown in FIG. 2.

FIGS. 5A–5F are perspective cross-sectional views of a second method of the present invention that can be used to manufacture the first version of the memory cell shown in FIG. 3A that can be used in the first embodiment of the array shown in FIG. 2.

FIG. 6 is a schematic diagram of a second embodiment of an isolation-less, contact-less, array of floating gate nonvolatile memory cells of the present invention.

FIG. 7 is a perspective cross-sectional view of a first version of a memory cell that can be used in the second embodiment shown in FIG. 6.

FIG. 8 is a schematic diagram of a third embodiment of an isolation-less, contact-less, array of floating gate nonvolatile memory cells of the present invention.

FIG. 9A is a perspective cross-sectional view of a first version of a memory cell that can be used in the third embodiment of the array shown in FIG. 8.

FIG. 9B is a cross-sectional view of a second version of a memory cell that can be used in the third embodiment of the array shown in FIG. 8.

FIG. 9C is a perspective cross-sectional view of a third version of a memory cell that can be used in the third embodiment of the array shown in FIG. 8.

DETAILED DESCRIPTION OF THE INVENTION

First Embodiment

Referring to FIG. 2, there is a shown a schematic diagram of a first embodiment of an array 110 of floating gate nonvolatile memory cells of the present invention. The array 110 comprises a plurality of memory cells 112 arranged in a plurality of rows and columns. At the transistor level, each of the memory cells 112A is identical to the memory cell 12 shown in FIG. 1B. The difference between the array 110 shown in FIG. 2 and the array 10 shown in FIG. 1B is in the manner of the circuit connecting each of the memory cells 112. More particularly, for the memory array 110, each buried bit line 16 electrically connects to the first terminal of memory cells arranged in the same column with the adjacent memory cells in the same row sharing a common buried bit line. Thus, for example, memory cells 112B and memory cell 112C in the same row share a common buried bit line 16B. Further, each of the buried source lines 20 in the array 110 connects to the second terminal of memory cells arranged in the same column and wherein adjacent memory cells in the same row share a common buried source line. Thus, the memory cell 112A and memory cell 112B share a common buried source line 20A. In all other aspects, the memory array 110 is connected in the same manner as the memory array 10 shown in FIG. 1B.

As a result of this change in the interconnection of memory cells in the same row, it is possible to further compact the memory array 110.

Referring to FIG. 3A, there is shown a first version of the memory cell $112_1$ for use in the memory array 110. As is well known, the array of nonvolatile memory cells 110 is made from a semiconductive substrate 50, such as single crystalline silicon. The substrate 50 has a planar surface 52. The plurality of nonvolatile memory cells 112 are formed in the substrate 50 and are arranged in a plurality of rows and columns. Each memory cell $112_1$ has a portion thereof constructed in a trench in the substrate 50. A plurality of trenches are in the substrate which are substantially parallel to one another with each trench having a first side wall, a second side wall and a bottom wall. The buried source line 20 is along the bottom wall of a trench. The floating gates of a pair of adjacent memory cells in the same column are positioned in the same trench insulated from the side walls of the trench. Thus, floating gate 22A of memory cell 112A is insulated from the first side wall of the trench. The floating gate 22B of the second memory cell 112B in the same column is adjacent to the first memory cell 112A and is positioned in the same trench. The floating gate 22B is insulated from the second side wall. The adjacent memory cells 112A and 112B share a common control gate 24A which is also positioned in the trench and is insulated from both of the floating gates 22A and 22B. Adjacent to each trench is a planar surface 52 portion of the substrate 50. A transistor gate 14 of the memory cell 112 is insulated and is space apart from the planar surface 52 with the transistor gate 14 adjacent to the trench. Finally, the buried bit line 16 is also along the planar surface 52 and is adjacent to the transistor gate 14. In fact, the buried bit line 16 is between a pair of transistor gates 14 of adjacent memory cells 112A.

Referring to FIG. 3B, there is shown a second version of the memory cell $112_2$ for use in the first embodiment of the array 110. In the second version shown in FIG. 3B, the transistor gates 14 of adjacent memory cells 112 are positioned in the trench. The floating gate 22 and the control gate 24 are also partially in the trench 58.

Method of Manufacturing I

Referring to FIGS. 4A–4J, there is shown a first method for making the first version of the memory cell $112_1$ shown in FIG. 3A for use in the first embodiment of the array 110 shown in FIG. 2. The isolation-less, contact-less memory cell array 110 using the memory cell $112_1$ begins by a substrate 50 of a single crystalline semiconductive material such as silicon. Silicon nitride 54 is deposited on the surface 52 of the substrate 50 and is then patterned to form openings 56. The openings 56 are a plurality of columns or strips which are opened in the silicon nitride 54 exposing the surface 52 of the substrate 50. This can be done, by conventional photo-lithographic technique using masking and etching. It should be noted, that as used herein the term "column" or "row" may be used interchangeably and is not limited to specific directions.

The next step is to cut trenches 58 into the substrate 50 through the openings 56. Each trench 58 extends continuously in a column direction. This is shown in FIG. 4B. The resultant trench 58 has two side walls and a bottom wall. This exposes the silicon substrate 50 in the trench 58.

An oxidation process is performed to oxidize the exposed silicon within the trenches 58 of the substrate 50. This can be done, for example, by thermal oxidation of the structure shown in FIG. 4B, for 1000 degrees for 60 second. The result is the formation of a layer 60 of silicon dioxide along the side walls and along the bottom wall of the trench 58. The layer 60 of silicon dioxide is approximately eighty (80) angstroms thick. It should be recognized that the dimensions disclosed herein and the processes disclosed herein are for a lithography process of 90 nm dimension. Clearly, sizing to a different lithography size would change the dimensions of thickness, time, temperature, etc. A layer of polysilicon 62 is then deposited everywhere, including on the layer of silicon dioxide 60. The layer 62 of polysilicon is then anisotropically etched forming a spacer of polysilicon 62 along each of the two side walls of the trench 58.

The polysilicon spacers 62 along the two side walls of the trench 58 can be shaped such that a tip is formed along one end thereof, the end farthest away from the bottom wall of the trench 58. This can be accomplished by depositing polysilicon such that it completely fills the trench 58. A planarizing etch process, such as chemical-mechanical-polishing (CMP), leaves the polysilicon surface level with the top of the nitride 54. A further etch recesses the polysilicon to the desired level. A sloped etch such that polysilicon 62 adjacent to nitride 54 is etched slower results in an acute angle forming at the interface of polysilicon 62 and nitride 54. An oxide dielectric spacer formed by oxide deposition and anisotropic etch defines a thickness region adjacent to each trench edge of nitride 54. This oxide serves as an etch mask so that polysilicon 62 is separated into two pieces, one piece for each side wall of the trench 58.

Alternatively, a tip can be formed at the other end of the polysilicon spacer 62, the end closest to the bottom wall of the trench 58. This can be accomplished by forming the trench wall 58 with an obtuse angle relative to the trench bottom. Polysilicon spacers 62 are formed by deposition and vertical etch. This leaves a polysilicon spacer along each of the side walls of the trench 58. The angle difference between the wall-side polysilicon face and the open-side polysilicon face forms a tapered shape to the polysilicon spacer with the narrow end closest to the bottom wall of the trench 58. With sufficient angle and depth, this taper forms a sharp tip.

The choice of whether the tip is formed at one end of the polysilicon spacer 62 which is farthest away from the bottom wall of the trench 58 or is at the end which is closest to the bottom wall of the trench 58 depends upon the manner of erase that is desired, as will be explained hereinafter. In any event, the tip at either one end or the other end of the spacer 62 is formed. An implant step is then performed which forms the buried source line 20 along the bottom wall of the trench 58. The resultant structure is shown in FIG. 4C.

A thermal oxide process is then performed which oxidizes the polysilicon spacer 62 and forms an oxide region 64 which covers the polysilicon spacer 62 along the side walls of the trench 58. In addition, the thermal oxide process oxidizes the silicon substrate 50 along the bottom wall of the trench 58. The layer of oxide 64 then covers the polysilicon spacer 62 and along the bottom wall of the trench 58. Polysilicon 66 is then deposited everywhere and fills the trench 58. CMP (chemical mechanical polishing) is then used to remove the polysilicon 66 deposited on the silicon nitride 54, and to planarize the polysilicon 66 so that the level of the polysilicon 66 in the trench 58 is planar with the level of the silicon nitride 54. Preferably, the polysilicon 66 is then etched (by Reactive Ion Etch (RIE)) to a level below the top surface of the silicon nitride 54. The resultant structure is shown in FIG. 4D.

A photoresist masking step is then performed in which strips of openings in the photoresist 70 are formed in a direction substantially perpendicular to the direction in which the trenches 58 are formed. Thus, the strips expose portions of the silicon nitride 54 and portions of the polysilicon 66 that are in the trenches 58. Through selective RIE etching, the polysilicon 66 is removed from the exposed portion within the trench 58. After the polysilicon 66 is removed, with the oxide 64 used as an etch stop, the etchant is changed so that RIE etching further proceeds to cut the silicon dioxide 64 with silicon as the etch stop. After the silicon dioxide layer 64 is removed, RIE etching continues until the polysilicon 62 along the side walls of the trench 58 is cut in the opening 68 stopping at the oxide layer 60. The result is a pair of discontinuous polysilicon spacers 62 within a trench 58. The resulting structure is shown on FIG. 4E.

The photoresist 70 is then removed and the entire structure is filled with silicon dioxide 72 which fills the "cuts" within opening 68. In addition, silicon dioxide 74 covers the polysilicon 66 in the areas within the trench 58 covered by the photoresist 70. CMP polishing is then performed which removes the oxide from the top surface of the silicon nitride 54. The resultant structure is shown in FIG. 4F.

Selective chemical or RIE etching of silicon nitride 54 is then performed which removes the silicon nitride 54. The resultant structure is shown in FIG. 4G.

A silicon dioxide layer 76 is then deposited over the entire surface of the structure shown in FIG. 4G. Thereafter, a layer of polysilicon 78 is deposited over the silicon dioxide 76. An RIE etching of the polysilicon 78 is performed resulting in the polysilicon 78 formed as spacers abutting the silicon dioxide 76 immediately adjacent to the trench 58. the formation of spacers is well known in the art by which dimensions are controlled by film deposition thickness and etch removal rates. This allows for a compact structure not limited by lithographic node constraints. The resultant structure is shown in FIG. 4H.

An implantation of the structure shown in FIG. 4H is then performed. The ion implant forms the buried bit line 16 which lies between pairs of adjacent polysilicon spacer 78. The resultant structure is shown in FIG. 4I.

Word lines 30 are then connected with contacts through the silicon dioxide 76 into the polysilicon 66, which forms the control gate 24. Although contacts are used in the array to connect the word lines 30, the topography for a contact at the upper level is not as constrained as would be a contact to lower levels such as the bit line junction 16 or source junction 20. Therefore, this construct effects a more compact structure compared to a bit line contacted array The resultant structure is shown in FIG. 4J.

As can be seen from the foregoing, the array 110 with the memory cell 112 has buried bit lines, buried source lines, and does not have any field oxide or STI (Shallow Trench Isolation) to separate rows or columns of memory cells 112 within the array 110. Thus, the memory array 110 is an isolation-less array of floating gate memory cells.

Method of Manufacturing II

Referring to FIGS. 5A–5F, there is shown a sequence of steps for the second method of manufacturing the memory array 110 with the memory cell $112_1$. Again, in the first step, the substrate 50 having a planar surface 52 is used with no field oxide or shallow trench isolation formed to separate the rows and columns of memory cells formed or to be formed therein. A mask 54 such as silicon nitride is formed on the planar surface 52 of the substrate 50. A plurality of spaced apart openings 57 extending in a first direction (such as column direction) are formed in the silicon nitride 54. This can be done, for example by using photo resist and the conventional masking technique. This is exactly analogous to the first step shown in FIG. 4A. The resultant structure is shown in FIG. 5A.

Within each opening 57, silicon dioxide 76 is formed adjacent to the silicon nitride 54 and along the top planar surface 52 of the substrate 50. Thereafter, the polysilicon spacer 78 are formed with each of the polysilicon spacers 78 abutting the silicon dioxide layer 76 along the side wall of the opening 57 and immediately adjacent to the silicon nitride 54. Between the pair of polysilicon spacer 78, an ion implant is made to form the buried bit line 16. Finally, silicon dioxide 80 fills the space between the pair of polysilicon spacer 78 within each opening 57. The resultant structure is shown in FIG. 5B. The specific detail of the formation of the layer of silicon dioxide 76, the polysilicon spacer 78, the buried bit line 16, and the silicon dioxide 80 filling the region between the polysilicon spacer 78 is fully disclosed in U.S. Pat. No. 6,329,685, whose disclosure is incorporated herein by reference in its entirety. In particular, reference is made to FIGS. 2F–4 though 2I–4 and the description thereof, which details the formation of a similar structure.

After the structure shown on FIG. 5B is formed, the silicon nitride 54 is removed. This leaves a plurality spaced apart openings 56 where the silicon nitrite 54 had occupied. The resultant structure is shown in FIG. 5C.

Trenches 58 are then cut into the structure shown in FIG. 5C. This can be done by anisotropically etching the substrate 50 to form the trenches 58. This is the same as the formation of trenches 58 shown in FIG. 4B. The resultant structure is shown in FIG. 5D.

Similar to the steps described for the formation of the structure shown FIG. 4C, silicon dioxide 60 is formed along the side walls and the bottom wall of the trenches 58. Thereafter, polysilicon spacer 62 with tips at either the one end which is the end furthest away from the bottom wall or at the other end which is the end closest to the bottom wall of the trench 58 are formed, all in the same manner as previously described. Thereafter, implantation is performed to form the buried source line 20. The resultant structure is shown in FIG. 5E.

Similar to the process described in FIG. 4D, silicon dioxide 64 is then formed on the polysilicon spacer 62 and along the bottom wall of the trench 56. This is then followed by deposition of polysilicon 66 sufficient to fill the trench and on top of the silicon dioxide 80. The polysilicon 66 on the silicon dioxide 80 is then patterned in a second direction substantially perpendicular to the first direction with photoresist covering the word line 30 that is desired to be retained. Selective RIE or anisotropic etching is performed to remove the exposed polysilicon 66 in the trench 58. This also removes all the polysilicon 66 on the oxide 80 as well as the polysilicon 66 in the trench 58, exposing the silicon dioxide 80 and the silicon dioxide layer 64 within the trench 58. During the formation of the silicon dioxide 80, it must have been formed such that it would be thicker then silicon dioxide layer 64 within the trench 58. Thus, at this time, an RIE etch of silicon dioxide is performed. The etch would etch away the silicon dioxide 64 faster than the silicon dioxide 80 exposing the polysilicon spacers 62 before the polysilicon spacers 78 are exposed. Once the polysilicon 62 is exposed, selective etching of polysilicon 62 is used to etch away the polysilicon 62 to form islands of polysilicon 62 without etching the polysilicon spacer 78. The resultant structure is shown in FIG. 5F.

Method of Manufacturing III

A method to manufacture the array 110 using the second version of the memory cell $112_2$ shown in FIG. 3b is as follows. The steps of forming a layer silicon nitride 54, forming openings 56 and etching to form trenches 58 all as shown and described in FIGS. 4a and 4b are used. Thereafter, the bottom wall of the trench 58 is oxidized, forming the bottom oxide region. Bottom implant to form the buried bit lines 16 are also performed. Polysilicon is then deposited, then planarized, using e.g. CMP to the level of the nitride 54. The polysilicon is then etched back into the trench 54 to a level to form the gate 14. The top of the gate 14 is then oxidized. The formation of the floating gate 22 (except with the tip of the floating gate 22 beign closest to the gate 14 or the bottom of the trench 58) and the control gate 24 in the trench 58 would then be the same process as described in FIGS. 4c–4g, including the removal of the silicon nitride 54. Implant is then made forming the buried source lines 20, near the planar surface 52. Word line contacts 30 are then made as described in FIG. 4j.

The operation of the memory cell array 110 will now be explained. Let us assume that the selected memory cell 112C is to be read, programmed and erased.

Read Operation

Assume now that the cell 112C is to be read from the array 110 as shown in FIG. 2. The various voltages applied to the various lines are as follows. The selected source line, i.e. 20B, is held at ground. All of the unselected source lines 20 are also held at ground. The selected bit line, i.e. 16B, is supplied with a Vd voltage. All of the unselected bit lines 16 are held at 0 volt. The selected word line 30A is supplied with a Vg voltage which is sufficient to turn on the floating gate transistor 15C if the floating gate 22C is not programmed. If, however, the floating gate 22C is programmed, then the voltage of Vg is insufficient to turn on the channel, which is the portion along the side wall in the trench 58 adjacent to the floating gate 22C. All of the other unselected word lines 30 are held at ground. Finally, the gate 14C of the select transistor 11C is supplied with the Vg voltage. This voltage is sufficient to turn on the channel which is along the planar surface 52 between the bit line 16 and the trench 58. All of the other transistor gates 14 are held at ground or at negative voltage. As a result, it can be seen that if the floating gate 22C is charged, then the voltage thereon is sufficient to counteract the voltage Vg supplied to the control gate 24C and the channel adjacent to the floating gate, i.e. the portion along the side wall of the trench 58 adjacent to the floating gate 22C would not conduct charges. As a result, no current would flow through the memory cell 112C. If on the other hand, the floating gate 22C were not programmed, then the channel would conduct and since transistor gate 14C is also turned on, then there is a conduction path for electrons from the source line 20B to the bit line 16B and the memory cell 112C would conduct current.

As for disturbances on the unselected memory cells in the same row, since all of the unselected transistor gates 14 are at 0 volts or at a negative volt, then those memory cells 112 are not turned on. Thus, no current would flow in those memory cells in the same row. As for memory cells in the same column as memory cell 112C, since the unselected word line 30B is at ground, even if the floating gate 22G were not programmed, the 0 volts on the word line 30B is insufficient to turn on the channel adjacent to the floating gate 22G. Thus, memory cells 112G and others that are in the same column as the selected memory cell 112C, would not conduct any current.

Program Operation

To program the selected memory cell 112C, the following voltages are applied. The selected source line, 20B, is held at a positive voltage such as 4 volts. All the unselected source lines 20 are held floating. The selected bit line 16B is held at ground or 0 volts. All the unselected bit lines 16 are held at Vdd. Although this is not necessary, i.e. it is not necessary that the unselected bit lines 16 be supplied with a positive voltage, a positive voltage would further inhibit current flow between a source line and a bit line in case the ground voltage at the gate 14 is not sufficient. The selected word line 30A is raised to a high voltage such as 8 volts. All of the unselected word lines 30 are held to ground or other such low potential. The selected gate 14C is supplied with Vt voltage. All of the unselected gate lines 14 are held at ground. For the selected memory cell 112C, with the source line 20B at 4 volts, and the bit line 16B at 0 volts, and the gate line 14C being supplied with a positive voltage sufficient to turn on the channel of the transistor 11, and with the control gate 24C being at a high voltage to turn on the channel in the sidewall of the trench 58, electrons would traverse from the bit line 16B to the source line 20B, along the planar surface 52. Towards the trench 56, with the word line 30A at a high voltage, they experience an abrupt voltage increase and are injected on to the floating gate 22C. This injection of electrons on to the floating gate 22C is by the mechanism of source side injection or hot channel electron injection and is well known in the art and as described in U.S. Pat. No. 5,029,130. The electrons are injected until the floating gate 22C is charged to the point where it turns off the conduction of the channel in the side wall of the trench 58 adjacent to the floating gate 22C.

With respect to the disturbance on the memory cells 112 in the same row, since the gate lines 14 of the unselected memory cells 112 are at ground, those memory cells 112 are not turned on. Therefore, no electrons will conduct in the channel and none will be injected or programmed. With respect to the memory cells 112 in the same column, the word line 30 that is not selected is held at low to negative potential. In that event, it is insufficient to cause an abrupt voltage increase at the junction of the planar surface 52 and the trench 58 to cause electrons to be injected onto the floating gate 22. Thus, memory cells in the same column are also not disturbed.

Erase Operation

There are three possible erase operations. Each of the operations will then determine whether the floating gate 22 has a tip near the bottom wall of the trench 56 or has a tip near the end which is furthest away from bottom wall the trench 56. The tip, as disclosed in U.S. Pat. No. 5,029,130 facilitates the Fowler-Nordheim tunnel of electrons from the floating gate 22.

In the first embodiment, electrons tunnel from the floating gate 22C of memory cell 112C onto the control gate 24C and onto the word line 30A. The voltages applied to the various terminals of the selected memory cell 112C are as follows. The selected source line 20B at held at ground voltage. The unselected source lines 20 are floating. The selected bit line 16B is held at ground voltage. The unselected bit lines 16 are held floating. The selected word line 30A is raised to a high voltage such as 16 volts. The unselected word line 30 is held at ground volt. The selected gate line 14C is supplied with 0 volt. The unselected gate lines 14 are held at floating. Due to the high capacitive coupling between the control gate 24C and the floating gate 22C, and with the control gate 24C at a high voltage, the electrons from the floating gate 22C are attracted to the control gate 24C and through Fowler-Nordheim tunneling through the tip at the end which is furthest away from the bottom of the trench 58, the electrons are tunneled to the control gate 24C. It should be noted that with the high voltage on the selected word line 30A, all of the memory cells 112 in the same row will be erased simultaneously.

In a second erase mode, the floating gate 22C of the selected memory cell 112C is erased by having the electrons stored thereon tunnel from the floating gate 22C to the gate 14C of the select transistor 11C. The voltages applied to the array 110 are as follows. The selected source line 20B is supplied with ground voltage while the unselected source lines 20 remain floating. The selected bit line 16B is held at ground while the unselected bit lines are floating. The selected word line 30A is supplied with −10 volts while the unselected word lines 30 are supplied with ground volt. The selected gate line 14C is provided with a positive voltage Vg while the unselected gate lines 14 are floating. In this mode, with a capacitive coupling between the control gate 24C and the floating gate 22C, and with the high negative voltage applied to the control gate 24C, the electrons on the floating gate 22C are repelled by the control gate 24C and move closer to the side wall of the trench 58. Further, with the select gate line 14C at a positive voltage, the electrons on the floating gate 22C are then attracted to that positive potential and tunnel through the oxide layer 76 onto the select gate 14C. In this mode, only the memory cell 112C in the selected row 30A is erased. The electrons from the floating gate 24C tunnel through the tip furthest away from the bottom wall of the trench 56 and through the selected oxide layer 76 onto the select gate 14C.

In the third erase mode, electrons from the floating gate 24C of the selected memory cell 112C tunnel through oxide layer 60 onto the selected source line 20B. Thus, the voltages applied to the array 110 are as follows. The selected source line 20B is held at 4 volts, while the unselected source lines 20 are floating. No voltage is applied to the selected bit line 16B or any of the other bit lines 16. A negative voltage such as −8 volts is applied to the selected word line 30A. The unselected word lines 30 have 0 volts supplied thereto. The selected gate line 14C has 0 volts applied thereto. Unselected gate lines 14 are floating. Again, due to the high capacitive coupling between the control gate 24C and the floating gate 22C, a negative voltage applied to the selected control gate 24C would cause electrons to be repelled from the control gate 24C side of the floating gate 22C towards the side wall of the trench 58. Further, with the positive voltage applied to the selected source line 20B, electrons from the selected floating gate 22C are then attracted and tunnel through the oxide layer 60 and into the source line 20B. It should be noted that in this mode, the floating gates 22C and 22D that are in the same trench 58 are erased together simultaneously.

From the foregoing, it can be seen that with the second mode of erasure, bit erase is possible. This permits the array 110 to operate in a erase-verify-erase-verify mode whereby after each erase operation, the cell 112 is read to determine if the cell 112 has been completely erased and not over erased. Thus, by iteratively erasing and verifying, the bit can be erased without over erasing. For those bits that are completely erased, the erase operation can cease, while other bits which have not been completely erased can continued to be erased. Therefore, a novel scheme of erase-verify-erase sequence can be performed.

From the foregoing, it can be seen that with the array 110, there are no diffusions contacts in the array 110. Thus, the array 110 is a contact-less array. Further, there are no field isolation regions or field oxide or shallow trench isolations to isolate rows or columns of memory cells 112 from one another. This permits a further increase in density of the memory cell array 110. Finally, the gate 14 of the transistor 11 in each memory cell 112 assists in the operation of source side injection. It does not provide over erase protection. Hence, the ability to erase-verify-erase on a bit level as discussed hereinabove for erase mode 2 permits the memory array 110 to operate in a mode that does not create an over erase condition. Finally, with the cell array 110 and method of manufacturing, the array 110 can be made such that cells can erase into the control gate 24, or to the transistor gate 14 or to the buried source 20.

Second Embodiment

Referring to FIG. 6, there is shown a schematic diagram of a second embodiment of an array 210 of the present invention. The array 210 comprises a plurality of memory cells 212 arranged in a plurality of rows and columns. Each memory cell 212 comprises a floating gate nonvolatile transistor 15 having a floating gate 22 and a control gate 24 and a first terminal 16 and a second terminal 20. The plurality of memory cells 212 are connected such that memory cells 212 in the same row have their control gates 24 connected to a common word line 30. Memory cells 212 that are in the same column have their first terminal 16 connected together and their second terminals 20 connected together. Memory cells 212 in the same column adjacent to one another share a common first terminal 16 to one side and a common second terminal 20 to another side.

A preferred embodiment of the cell 212 used in the array 210 shown in FIG. 6, is shown in FIG. 7. The cell 212 is similar to the cell 112 shown in FIG. 3A except for the absence of the transistor gate 14 and with the bit line 16 directly abutting the trench 58.

The methods for manufacturing the cells 212 in the array 210 are substantially similar to the method shown and described in FIGS. 4A–4J and to the method shown and described in FIGS. 5A–5F.

Method of Manufacturing I

In the first method, the steps for the formation of the array 210 are the same as the steps shown and described in FIGS. 4A–4G. Thereafter, however, the silicon dioxide layer 76 is deposited on the structure in the trench region 58 and on the top planar surface 52. Ion implantation then follows which forms the buried bit line 16 which is between adjacent trenches 58. Finally, the steps as shown and described in FIG. 4J are performed for making contact to the control gate 24 through the word line 30.

Method of Manufacturing II

In a second method of making the memory array 210, the method employs steps that are similar to the steps shown and described for FIG. 5A. However, after the openings 57 are formed, only the layer of silicon dioxide 76 is formed along the side wall of the opening 57 and along the top planar surface 52 in each of the opening 57. Ion implantation occurs and the buried bit line 16 is formed. The silicon dioxide 80 covering the opening 57 is then deposited. From this structure, the method then proceeds in the same manner as the steps described and shown in FIGS. 5C to 5F. The resultant structure is the array 210 of memory cells 212.

Read Operation

The read operation for the array 210 is similar to the read operation for the array 110. Assume now that the selected memory cell 212C is to be read, then the voltages applied to the array 210 are as follows. For the selected word line 30A, a voltage Vg is applied. The unselected word lines 30 will have 0 volts applied thereto. For the selected source line 20A, 0 volts is applied. For the selected bit line 16B, a voltage of Vd is applied. For the unselected source line 20B and all source lines adjacent thereto, i.e. to the right of the selected memory cell 212C, the voltage Vd is applied to the unselected source lines 20. For the unselected bit lines 16, that are also to the "right" of the selected memory cell 212C, a voltage Vd is also applied. Thus, the voltage Vd is applied to the memory cells 212 to the right of the selected bit line 16B, to all of the unselected bit lines 16 and source lines 20, and all will have equal voltages. This would not turn on any of those memory cells 212. Similarly, for all the unselected bit lines 16, such as 16A, and unselected source lines 20 which are to the left of the selected source line 20A, a ground voltage is supplied thereto. Thus, the memory cells to the "left" of the selected memory cell 212C will also have equal voltage supplied to the source and bit lines, thereby not turning on the channel for those memory cells. In this manner, only the select memory cell 212C will have a current flowing thereto depending upon whether or not charges are stored on the floating gate 222B. For the memory cells, e.g. memory cell 212G which is in the same column, with the word line 30B not turned on, the memory cell 212G will also not be turned on.

Programming Operation

Similarly, for programming, the voltages supplied to the array 210 to program cell 212C is as follows. For the selected word line 30A, a high voltage such as +8 volts is supplied. For all unselected word lines, a ground voltage is supplied. The selected source line 20A is supplied with ground voltage and the selected bit line 16B is supplied with a positive voltage such as +4 volts. This would turn on the selected memory cell 212C and with the high voltage supply to the control gate 24C, electrons are then injected onto the floating gate through mechanism of source side injection or hot channel electron injection. To minimize the disturbance on the unselected memory cells 212, all of the unselected bit lines 16 and unselected source lines 20 to the right of the selected bit line 16B are supplied with 4 volts, the same voltage that is supplied to the selected bit line 16B. In this manner, all of the memory cells 212 to the right of the selected memory cell 212C will have the same voltage supplied to its source line 20 and its bit line 16 thereby not turning on the memory cells. Similarly, for all the memory cells 212 that are to the left of the selected memory cell 212C, 0 volts is supplied to the unselected source line 20 and the unselected bit lines 16 again not turning on those memory cells 212.

Erase Operation

There are two modes of erase operation for the memory array 210. In the first mode of operation, similar to the first mode described for the array 110, a high voltage such as +16 volts is supplied to the selected word line 30A. The unselected word line 30 is supplied with 0 volts. All of the source lines 20 and the bit lines 16 of both the selected and unselected lines are held at ground. In this manner, all of the memory cells 212 in the same row as the selected memory cell 212B are erased simultaneously.

In a second mode of operation, pairs of selected memory cells in the same trench are erased simultaneously. Thus, if memory cell 212B and memory cell 212C are made in the same trench, then they would be erased simultaneously. All other memory cells in the same row and in the same column and in different column would not be erased. In this mode, the voltages applied to the memory array 210 is as follows. For the selected word line 30A, a negative voltage such as −8 volts is applied to the word line 30A. A 0 volts or a voltage insufficient to attract the electrons from the floating gate 22D is supplied to the selected or unselected buried bit lines 16. For the selected source line 20A, a positive voltage of +4 volts is applied. All the other unselected source lines 20 would have 0 volts supplied thereto. Thus, the electrons from the floating gates 22B and 22C are repelled by the negative voltage on the control gate 24 and are attracted to the positive voltage from the selected source line 20A and through Fowler-Nordheim tunneling through silicon dioxide layer 60, they are tunneled to the source line 20A. All the other memory cells 212 would not be erased.

Third Embodiment

Referring to FIG. 8, there is shown a third embodiment of an array 310 of floating gate nonvolatile memory cells of the present invention. Again, similar to the embodiment of the arrays 110 and 210, the embodiment 310 is an isolation-less, contact-less array 310 of nonvolatile memory cells 312 arranged in a plurality of rows and columns. Each of the memory cell 312, e.g. memory cell 312A, comprises a first storage transistor 15A1 with a floating gate 22A1 with its associated control gate 24A1, a second storage transistor 15A2 with a floating gate 22A2 and its associated control gate 24A2, and a switch transistor 11A with a gate 14A. The switch transistor 11 is positioned between the two storage transistors 15X1 and 15X2. All of the memory cells 312 arranged in the same row have their control gates 24X1, and 24X2 connected together. Thus, control gate 24A1 is connected to control gate 24A2 of memory cell 312A which is connected to the control gate 24B1 and control gate 24B2 of memory cell 312B etc. Each memory cell 312 has a first terminal 16 which is a first end of the first storage transistor 15X1, and a second terminal 20 which is a second end of the second storage transistor 15X2. The array of memory cells 310 is arranged such that memory cells 312 in the same column have the same first terminal 16 connected together and have their same second terminals 20 connected together. Further, columns of the memory cells 312 in adjacent rows share a common second terminal 20 with an adjacent column of memory cells 312. Thus, the second terminal 20A is shared by the column of memory cells in the same column including memory cell 312A with the column of memory cells including memory cell 312B. Similarly, to the other side of the column of memory cells including cell 312B, the memory cells share a first terminal 16. Thus, memory cell 312B and the memory cells in the column share a first terminal 16B with memory cell 312C and the memory cells in the same column. Finally, all of the transistor gates 14 of the transistors 11 in the same column are connected together.

Referring to FIG. 9A, there is shown one version of a memory cell $312_1$ that can be used in the array 310 of the present invention. The memory cell 312 comprises two trenches 58A and 58B. At the bottom wall of the first trench 58A is the buried bit line 16. At the bottom wall of the second trench 58B is the buried source line 20. As can be seen in FIG. 8, in the array 310, the source lines 20 and the bit lines 16 are identical and interchangeable. The terms apply relative to a given cell but may be interchanged for one another relative to other cells. They may both be referred to as bit lines. Similar to the embodiment shown in FIG. 3A and FIG. 7, each trench has two side walls. Along one side of the wall is a floating gate 62A for the memory cell $312_1$. Along another side wall of the second trench 58B is the floating gate 62B for the memory cell 312A. A planar top surface 52 is between the two trenches 58A and 58B. Positioned above the planar surface 52 is the transistor gate 78. Within each of the first and second trenches 58A and 58B is a control gate 66A and 66B, respectively. Each of the control gates 66A and 66B is connected to the word line 30 at a position above the top planar surface 52 of the substrate 50.

Referring to FIG. 9B, there is shown a second version of a memory cell $312_2$ that can be used in the array 310 shown in FIG. 8. In the version shown in FIG. 9B, the transistor gate 314 is in a trench 58 along with the floating gates 22a1 and 22a2.

Referring to FIG. 9C, there is shown a third version of a memory cell $312_3$ that can be used in the array 310 shown in FIG. 8. In this version, the first and second storage transistors 15X1 and 15X2, and the gate transistors 11 are all above the planar surface 52 of the substrate 50. There is no trench 58 formed in the surface 52 into the substrate 50.

There are two methods to form the first version of the memory cell $312_1$ shown in FIG. 9A for use in the array 310 and one method to form the second version of the memory cell $312_2$ shown in FIG. 9B. The first method is based upon the method shown and described in FIGS. 4A–4J. The second method is based upon the steps shown and described in FIGS. 5A–5F. The third method is based upon the method to make the embodiment shown in FIG. 3B.

Method of Manufacturing I

In the first method, the steps of forming the trenches 58, with the floating gate 22 and the control gate 24 therein as shown and described in FIGS. 4A–4G are the same steps used in forming the memory cell 312 shown in FIG. 9A. Thereafter, an oxide layer 76 is deposited over the structure shown in FIG. 4G and the polysilicon 78 which forms the transistor gate 14 is deposited on the oxide 76, same as that shown for FIG. 4H. However, etching of the gate into separate spacers is not required; furthermore, the buried bit line 16 formed in the planar surface 52 of the substrate 50, as shown in FIG. 4I is not performed. Finally, the word line 30 and the contact to the control gate through the oxide 76 is established similar to the steps shown and described in FIG. 4J.

Method of Manufacturing II

In a second method for forming the memory cell 312 shown in FIG. 9A for use in the array 310, the steps of forming openings 57 on a substrate 50 on the surface 52 of the substrate is the same as shown and described in FIG. 5A. A layer of silicon dioxide 76 is then deposited within each of the openings 57. A polysilicon layer 78 which forms the transistor gate 14 is then deposited on the silicon dioxide 76. Unlike the structure shown in FIG. 5B, the implant forming the buried the bit line 16 is not performed. The polysilicon 78 is then covered with oxide layer 80. Thereafter, the steps of removing the silicon nitride 54 and the formation of the oxide and the floating gate therein and the control gate and word line 30 contact to the control gate all as shown and described in FIGS. 5C–5F are used. Alternatively, the stripes of oxide "hard mask" 80 over polysilicon 78 over gate oxide 76 can be patterned by conventional gate definition lithography as is well known in the art.

Method of Manufacturing III

In a method for forming the memory cell 312₂ shown in FIG. 9B the steps are similar to the steps shown and described for the making of the embodiment shown in FIG. 3B, except that there is no implant to form the buried bit line 16 at the bottom wall of each trench 58.

The operation for the memory arrays 310 is as follows.

Read Operation

Let us assume that the memory cell 312B is to be read. Further, since within the memory cell 312B there are two storage transistors 15B1 and 15B2, let us assume that it is desired to read the state of the floating gate 22B1 of the storage transistor 15B1. In that event, the voltages applied are as follows. The source line 20A is supplied with ground voltage. The bit line 16B is supplied with the voltage of Vd. All other bit lines 16 and source lines 20 that are unselected are supplied with ground voltage. The select gate transistor line 14B is supplied with a voltage Vg which is sufficient to turn on the transistor 11B. All other unselected transistors 11 have zero volts applied to their gate 14, thereby turning off the transistors 11. Therefore, even though there is a voltage difference between the source line 20B and the bit line 16B, the fact that the gate 14 of the transistors 11 of all the memory cells 312 in that column is turned off means that there is no conduction of current in any of those transistors 11. The select word line 30A is supplied with a Vg voltage. The unselected word lines 30B, etc. are supplied with a ground voltage, thereby turning off those storage transistors 15.

The voltage Vg on the selected word line 30A is sufficient to turn on all the storage transistors 15 of all the memory cells 312 in the selected row. The voltage Vd supplied on the drain 16B will then be passed on to the virtual source/drain between the transistor 11B and the storage transistor 15B2. Since the gate of the transistor 11B is on, a virtual drain voltage will then be passed to the virtual source/drain between the transistor 11B and the storage transistor 15B1. This voltage equals Vb-Vt where Vb is the voltage supplied to the gate 14B and Vt is the threshold voltage of the transistor 11B. This voltage is fixed and is independent of the load through the storage transistor 15B2. The transistor 111B acts as an internal cascode device such that changes in the floating gate 22B2 do not affect the source side cell voltage. This cascoding action is inherently current sensing and, thus, the current that passes through the storage transistor 15B1 will depend upon the bias Vb and the state of the floating gate 22B1.

Similarly, to sense or read the state of the storage transistor 15B2, the voltages on the bit line 16B and the voltage on the source line 20A are reversed. The current passing through the memory cell 15B2 is determined by the bias Vb and the state of the floating gate 22B2.

Programming Operation

Again, for purposes of explanation, let us assume that the second storage transistor 15B2 of the memory cell 312B is to be programmed. The selected word line 30A is supplied with a high positive voltage such as +8 volt and the unselected word lines 30 are held at ground. The bit line 16B is supplied with +4 volts while all the unselected bit lines 16 are held at ground. The gate 14B of transistor 11B is supplied with a voltage Vt sufficient to turn on the transistor 11B. The gate 14 of the unselected transistors 11 are supplied with zero volts. The voltage at the selected source 20A is supplied with zero volts. The voltage of the unselected source lines 20 are also supplied with zero voltage.

In operation, the voltage Vpp, such as +8 volts, supplied to the selected word line 30A is sufficient to turn on all of the storage transistors 15 in all of the memory cells 312 in the same row, accessed by the selected word line 30A. The storage transistor 15B1 closest to the source line 20A which is supplied with zero volts is on and will pass the zero volts to the source/drain for the selected transistor 11B. Since the gate 14 of the select transistor 11B is supplied with Vt voltage, it will be turned on and it will control the current passing through that transistor 11. The current that is passed in the channel region which is near the top planar surface 52 directly underneath the selected gate 14B will be attracted to the floating gate 22B2. Since the floating gate 22B2 is highly capacitively coupled to the control gate 24B2, the floating gate 22B2 sees a high voltage. This high voltage is sufficient to cause the electrons in the channel region underneath the selected gate 14B to be injected through the oxide region 60 and onto the floating gate 22B2 by the mechanism of source side injection or hot channel injection. Because the selected word line 30A turns on all of the storage transistors 15 in the same row, the source side injection field and the current is controlled by the programming gate 14B of the select transistor 11B. Therefore, since the unselected transistors 11A, 11C, etc. are held at zero volts, those memory cells 312 will not be programmed.

To program the storage transistor 15B1, the voltages on the bit lines through 16B and the source line 20A are simply reversed.

Erase Operation

Similar to the explanation with regard to the erase operation for the memory cell 112 shown in FIG. 3A, there are three erase modes of operation.

In a first mode, a positive high voltage, such as +16 volts, is applied to the select word line 30A. The selected bit line 16B and the selected source line 20A are held at ground. All of the unselected bit lines 16 and source lines 20 are floating or held at ground. The unselected word line 30 is held at ground. As a result, all of the memory cells 312 in the same row 30A are erased simultaneously. This is done by the mechanism of Fowler-Nordheim tunneling from the floating gate 22 to its respective control gate 24 onto the word line 30A, as discussed previously.

In a second mode, the selected word 30A is supplied with a high negative voltage, such as −10 volts. The gate 14B of the selected transistor 11B of the select memory cell 312B is supplied with a positive voltage. This positive voltage is sufficient to attract the electrons stored on the floating gates 22B1 and 22B2 of the respective storage transistors 15B1 and 15B2 sufficient to attract the electrons stored on the floating gate 22B1 and floating gate 22B2 of the select memory cell 312B to cause Fowler-Nordheim tunneling of all the electrons stored on those floating gates onto the select gate 14B. All other gates 14 of the transistors 11 of the memory cells 312 which are not selected are supplied with zero volts. In this manner, Fowler-Nordheim tunneling of the electrons from the floating gate 22 of the select storage transistors 15B1 and 15B2 will tunnel to the gate 14B. Only select memory cell 312B will be erased. Further, the previous discussion with regard to the method of iterative erasing, i.e., erase-verify-erase, can be used to erase an entire row of memory cells 312 but without any individual memory cell 312B over-erased. In this mode, similar to the mode heretofore, each of the floating gates 322 will have a tip at an end which is farthest away from the bottom wall of the trench to facilitate the tunneling of electrons from the floating gate 22 onto the select gate 314.

Finally, in a third mode erase, a negative voltage, such as −8 volt, is applied to the select word line 30A. The unselected word lines 30 will have zero volts supplied thereto. A select bit line 16b is supplied with +4 volts. All of the unselected bit lines 16 and all of the source lines 20 are held at zero volts. In this mode, the floating gates 22 of a pair of storage transistors 15 having their floating gates share the same trench are erased simultaneously. Thus, floating gate 22B2 of memory cell 312B and 22C1 of memory cell 312C are erased simultaneously.

From the foregoing it can be sent that a compact contactless, isolation-less array of floating gate non-volatile memory cells, and its method of manufacturing, and various modes of operation is disclosed.

What is claimed is:

1. An array of non-volatile memory cells comprising:
   a semiconductor substrate;
   a plurality of non-volatile memory cells formed in said substrate, arranged in a plurality of rows and columns;
   each memory cell comprising;
   a first terminal and a second terminal with a channel therebetween in said substrate, said channel having a first portion and a second portion;
   a transistor gate insulated from said substrate and positioned to control the conduction of current in said first portion of said channel;
   a floating gate insulated from said substrate and positioned to control the conduction of current in said second portion of said channel;
   a control gate capacitively coupled to the floating gate;
   a plurality of buried bit lines in said substrate arranged substantially parallel to one another;
   each buried bit line electrically connected to the first terminal of memory cells arranged in the same column; wherein adjacent memory cells in the same row share a common buried bit line;
   a plurality of buried source lines in said substrate arranged substantially parallel to one another; each buried source line electrically connected to the second terminal of memory cells arranged in the same column; wherein adjacent memory cells in the same row share a common buried source line;
   a plurality of gate lines arranged substantially parallel to one another, each gate line electrically connected to the transistor gate of memory cells arranged in the same column; and
   a plurality of word lines ranged substantively parallel to one another, each word line electrically connected to the control gate of memory cells arranged in the same row.

2. The array of claim 1 wherein said first portion of said channel is adjacent to said first terminal, and said second portion of said channel is adjacent to and between said first portion of said channel and said second terminal and wherein said buried bit line is between adjacent transistor gates of cells adjacent to one another in the same row; and wherein said buried source line is between adjacent floating gates of cells adjacent to one another in the same row.

3. The array of claim 2 further comprising;
   a plurality of trenches in said substrate substantially parallel to one another each trench having a first sidewall, a second sidewall and a bottom wall;
   each buried source line being along said bottom wall of a trench;
   wherein floating gates of first memory cells in the same column are positioned in the same trench insulated from said first sidewall, and floating gates of second memory cells in the same column, adjacent to said first memory cells are positioned in said same trench insulated from said second sidewall.

4. The array of claim 3 wherein adjacent memory cells in the same row share a common control gate and wherein said common control gate is positioned in said trench insulated from said floating gates.

5. The array of claim 4 wherein said plurality of trenches are spaced apart from one another, with a substantially planar surface on said substrate between each pair of adjacent trenches; wherein transistor gates of memory cells, are insulated and spaced apart from the planar surface, and each transistor gate is adjacent to a trench.

6. The array of claim 5 wherein each of said buried bit lines is in said substrate along said planar surface and between a pair of transistor gates.

7. The array of claim 2 further comprising;
   a plurality of trenches in said substrate substantially parallel to one another; each trench having a first sidewall, a second sidewall and a bottom wall;
   each buried bit line being along said bottom wall of a trench;
   wherein transistor gates of first memory cells in the same column are positioned in the same trench insulated from said first sidewall, and transistor gates of second memory cells in the same column, adjacent to said first memory cells are positioned in said same trench insulated from said second sidewall.

8. The array of claim 7 wherein adjacent memory cells in the same row share a common transistor gate anti wherein said common transistor gate is positioned in said trench insulated from said first and second side walls.

9. The array of claim 8 wherein said plurality of trenches are spaced apart from one another, wit a substantially planar surface on said substrate between each pair of adjacent trenches; wherein floating gates of memory cells, are insulated and spaced apart from the planar surface, and each floating gate is adjacent to a trench.

10. The array of claim 9 wherein each of said buried source lines is in said substrate along said planar surface and between a pair of floating gates.

* * * * *